(12) United States Patent
Kim et al.

(10) Patent No.: US 10,529,712 B2
(45) Date of Patent: Jan. 7, 2020

(54) SEMICONDUCTOR DEVICE

(71) Applicant: SAMSUNG ELECTRONICS CO., LTD., Suwon-si, Gyeonggi-Do (KR)

(72) Inventors: Sung Min Kim, Incheon (KR); Dong Won Kim, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/971,483

(22) Filed: May 4, 2018

(65) Prior Publication Data

US 2019/0139955 A1   May 9, 2019

(30) Foreign Application Priority Data

Nov. 7, 2017   (KR) .................. 10-2017-0147238
Dec. 5, 2017   (KR) .................. 10-2017-0165794

(51) Int. Cl.
*H01L 29/06* (2006.01)
*H01L 27/088* (2006.01)
(Continued)

(52) U.S. Cl.
CPC .... *H01L 27/0886* (2013.01); *H01L 21/76229* (2013.01); *H01L 21/823418* (2013.01); *H01L 21/823431* (2013.01); *H01L 21/823437* (2013.01); *H01L 21/823481* (2013.01); *H01L 23/485* (2013.01); *H01L 23/528* (2013.01); *H01L 27/0207* (2013.01); *H01L 29/0649* (2013.01); *H01L 29/0847* (2013.01); *H01L 29/41791* (2013.01); *H01L 29/66545* (2013.01); *H01L 29/66636* (2013.01); *H01L 21/0274* (2013.01); *H01L 21/02636* (2013.01); *H01L 21/3065* (2013.01); *H01L 21/3086* (2013.01); *H01L 21/31116* (2013.01); *H01L 21/76224* (2013.01)

(58) Field of Classification Search
CPC ............. H01L 27/0886; H01L 27/0207; H01L 29/0847; H01L 29/0649; H01L 29/66545; H01L 29/41791; H01L 29/66636; H01L 21/823481; H01L 21/823431; H01L 21/823437; H01L 21/823418; H01L 21/3065; H01L 21/0274; H01L 21/3086; H01L 21/76224; H01L 21/02636; H01L 21/31116
See application file for complete search history.

(56) References Cited

U.S. PATENT DOCUMENTS 7,709,893 B2   5/2010   Bauer et al.
7,812,373 B2   10/2010  Bauer et al.
(Continued)

*Primary Examiner* — Ahmed N Sefer
(74) *Attorney, Agent, or Firm* — F. Chau & Associates, LLC

(57) ABSTRACT

A semiconductor device includes a substrate, a fin structure protruding from the substrate in a direction perpendicular to an upper surface of the substrate, the fin structure including first fin regions extending in a first direction and second fin regions extending in a second direction different from the first direction, source/drain regions disposed on the fin structure, a gate structure intersecting the fin structure, a first contact connected to one of the source/drain regions, and a second contact connected to the gate structure and being between the second fin regions in plan view.

18 Claims, 28 Drawing Sheets

(51) Int. Cl.
  *H01L 23/528*   (2006.01)
  *H01L 27/02*    (2006.01)
  *H01L 29/08*    (2006.01)
  *H01L 21/8234*  (2006.01)
  *H01L 29/66*    (2006.01)
  *H01L 29/417*   (2006.01)
  *H01L 21/762*   (2006.01)
  *H01L 23/485*   (2006.01)
  *H01L 21/02*        (2006.01)
  *H01L 21/027*       (2006.01)
  *H01L 21/3065*      (2006.01)
  *H01L 21/308*       (2006.01)
  *H01L 21/311*       (2006.01)

(56) References Cited

U.S. PATENT DOCUMENTS

| | | | |
|---|---|---|---|
| 7,830,703 B2 | 11/2010 | Takeda et al. | |
| 8,258,572 B2 | 9/2012 | Liaw | |
| 8,872,220 B2 | 10/2014 | Xiong et al. | |
| 8,987,831 B2 | 3/2015 | Liaw | |
| 9,711,611 B2 | 7/2017 | Chiang et al. | |
| 9,818,875 B1* | 11/2017 | Bi | H01L 29/785 |
| 2004/0110331 A1* | 6/2004 | Yeo | H01L 21/823828 438/199 |
| 2013/0181297 A1* | 7/2013 | Liaw | G11C 11/412 257/390 |
| 2014/0001562 A1* | 1/2014 | Liaw | H01L 21/823431 257/369 |
| 2014/0339641 A1* | 11/2014 | Hong | H01L 27/0886 257/368 |
| 2015/0221644 A1* | 8/2015 | Baek | H01L 27/0886 257/401 |
| 2016/0079354 A1* | 3/2016 | Park | H01L 27/0886 257/386 |
| 2016/0172359 A1* | 6/2016 | Yoon | H01L 27/0886 257/401 |
| 2016/0197074 A1* | 7/2016 | Lee | H01L 27/0924 257/369 |
| 2016/0322304 A1* | 11/2016 | Kim | H01L 21/76897 |
| 2016/0351575 A1* | 12/2016 | Hung | H01L 27/1108 |
| 2016/0379982 A1* | 12/2016 | You | H01L 29/0657 257/369 |
| 2017/0194487 A1* | 7/2017 | Chen | H01L 29/0649 |

* cited by examiner

VIII-VIII'

SEMICONDUCTOR DEVICE

CROSS-REFERENCE TO RELATED APPLICATIONS

This application claims priority under 35 U.S.C. § 119 to Korean Patent Application No. 10-2017-0147238, filed on Nov. 7, 2017 and Korean Patent Application No. 10-2017-0165794, filed on Dec. 5, 2017, in the Korean Intellectual Property Office, the disclosures of which are herein incorporated by reference in their entirety.

TECHNICAL FIELD

Example embodiments of the present inventive concept relate to a semiconductor device, and more particularly, to a semiconductor device capable of reducing parasitic capacitance and short failure.

DISCUSSION OF RELATED ART

Semiconductor devices are classified into a memory device storing data and a logic device, such as a processor, processing data. In accordance with increased demand for miniaturized, high-performance, low-power semiconductor devices, semiconductor devices having a three-dimensional (3D) structure have been developed. With the increased density and decreased critical dimensions of these miniaturized 3D semiconductor devices, without proper structure design, parasitic capacitance and possible short failure between interconnects may rise, thereby causing performance degradation or failure to the semiconductor devices.

SUMMARY

According to an example embodiment of the present inventive concept, a semiconductor device includes a substrate, a first fin structure, source/drain regions, a gate structure, a first contact, and a second contact. The first fin structure protrudes from the substrate in a direction perpendicular to an upper surface of the substrate and includes first fin regions and second fin regions. The first fin regions extend in a first direction. The second fin regions extend in a second direction different from the first direction. The source/drain regions are disposed on the first fin structure. The gate structure intersects the first fin structure. The first contact is connected to one of the source/drain regions. The second contact is connected to the gate structure and is between the second fin regions in plan view.

According to an example embodiment of the present inventive concept, a semiconductor device includes a substrate, a first fin structure and a second fin structure, a gate structure, and a gate contact. The substrate includes a first region and a second region. The first fin structure and the second fin structure extend to be spaced apart from each other in a first direction parallel to an upper surface of the substrate, in the first region and the second region. The gate structure intersects at least one of the first fin structure and the second fin structure. The gate contact is connected to the gate structure. A distance between the first fin structure and the second fin structure in the first region is less than a distance between the first fin structure and the second fin structure in the second region. The gate contact is disposed between the first fin structure and the second fin structure in the second region, in plan view.

According to an example embodiment of the present inventive concept, a semiconductor device includes a substrate, a first fin structure, a second fin structure, a gate structure, a gate contact. The substrate includes an isolation region and an active region. The isolation region includes a first isolation region and a second isolation region. The active region includes a first active region and a second active region that are separated by the isolation region. The first fin structure is in the first active region. The second fin structure is in the second active region. The gate structure intersects the first fin structure. The gate contact is connected to the gate structure and is adjacent to a boundary between the first active region and the second isolation region. The first fin structure includes first fin regions and second fin region. The first fin regions extend in a first direction. The second fin region connects the first fin regions and extends in a second direction different from the first direction.

BRIEF DESCRIPTION OF THE DRAWINGS

Example embodiments of the present inventive concept will be more clearly understood from the following detailed description taken in conjunction with the accompanying drawings, in which.

Figure 1:
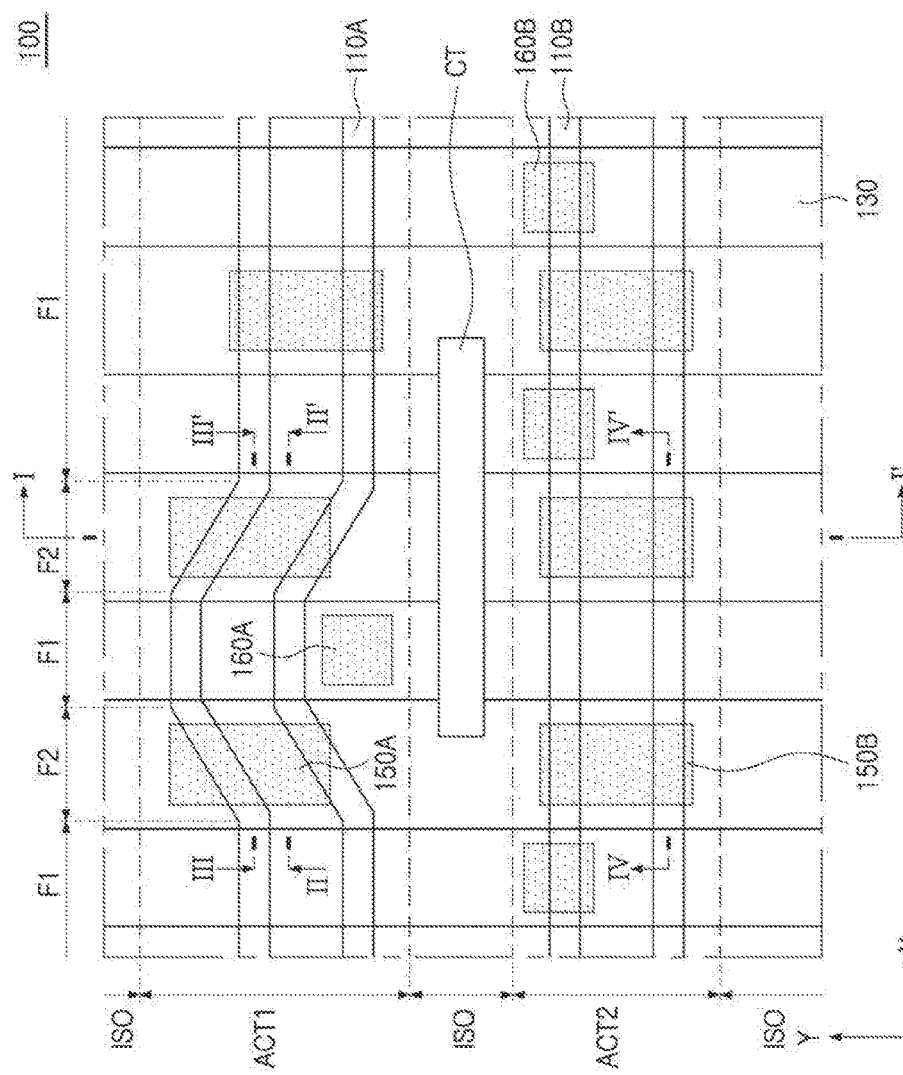
FIG. 1 is a plan view illustrating a semiconductor device according to an example embodiment of the present inventive concept.

Since the drawings in FIGS. 1-28 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Various example embodiments will now be described more fully hereinafter with reference to the accompanying drawings. Like reference numerals may refer to like elements throughout this application.

FIG. 1 is a plan view illustrating a semiconductor device according to an example embodiment of the present inventive concept. FIGS. 2 to 5 are cross-sectional views taken along lines I-I', II-II', III-III', and IV-IV', respectively, of FIG. 1.

Figure 2:
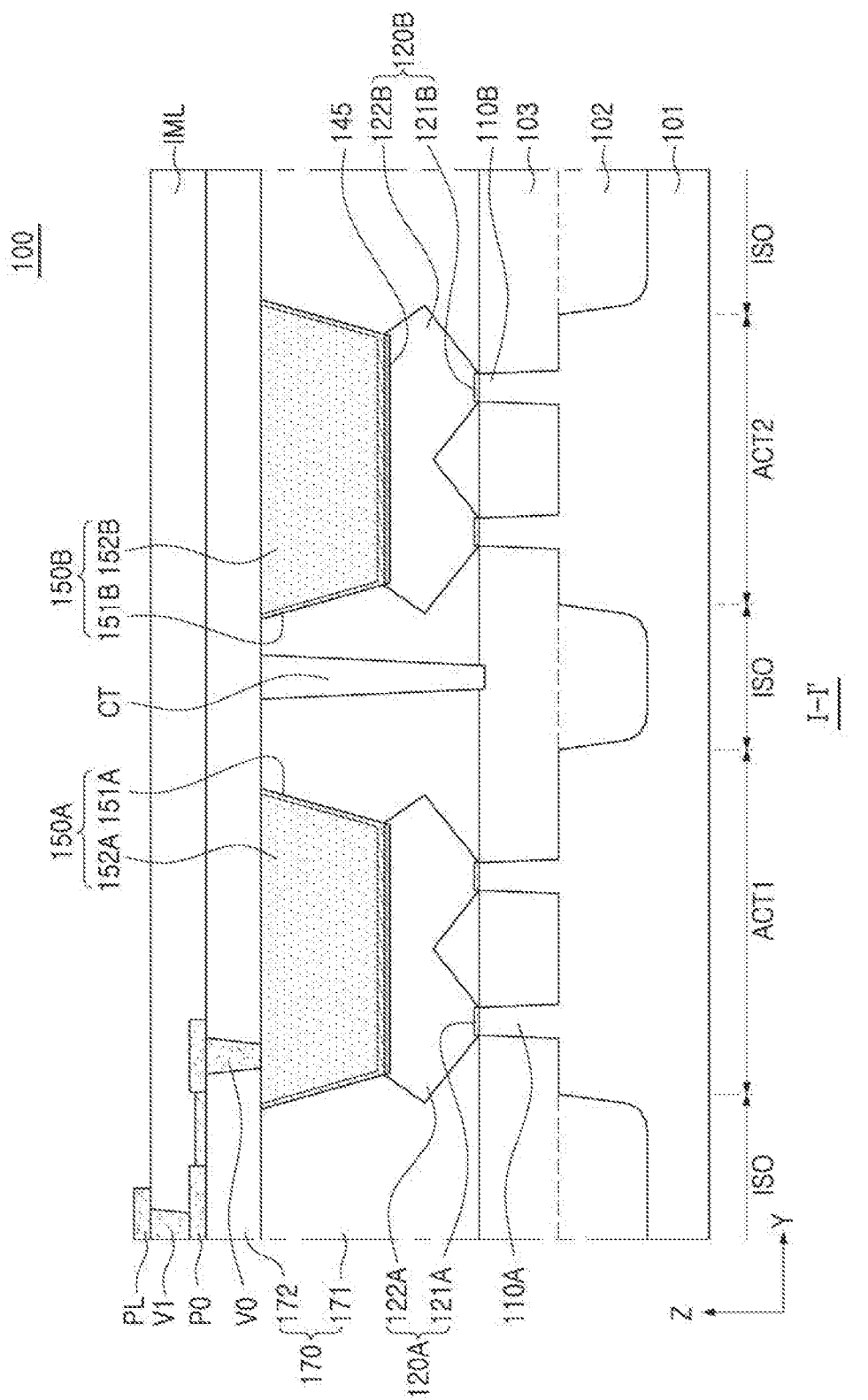
FIG. 2 is a cross-sectional view taken along line I-I' of FIG. 1.

Referring to FIGS. 1 and 2, a semiconductor device 100 includes fin structures, e.g., first and second fin structures, 110A and 1101B and a gate structure 130. The first and second fin structures 110A and 110B may extend in a first direction X and may be spaced apart from each other in a second direction Y. The first direction X may be perpendicular to the second direction Y. The gate structure 130 may extend in the second direction Y and may intersect the first and second fin structures 110A and 110B. The first and second fin structures 110A and 110B may protrude from a semiconductor substrate 101 in a direction perpendicular to an upper surface of the semiconductor substrate 101. Although two pair of the first and second fin structures 110A and 110B are provided on the semiconductor substrate 101 as shown in FIGS. 1 to 5, but the present inventive concept is not limited thereto. For example, more than two pairs of the first and second fin structures 110A and 110B may be provided on the semiconductor substrate 101. For example, a plurality of second fin structures may extend parallel to each other in the first direction X. Alternatively, one first fin structure 110A and/or one second fin structure 110B may be provided on the semiconductor substrate 101.

Areas including the first and second fin structures 110A and 110B are defined as active regions, e.g., a first active region ACT1 and a second active region ACT2, respectively. An isolation region ISO may be disposed between and separating the first active region ACT1 and the second active region ACT2. For example, the semiconductor substrate 101 may include the first and second active regions ACT1 and ACT2 and the isolation region ISO. The isolation region ISO may include an insulating material. In an example embodiment of the present inventive concept, the first active region ACT1 and the second active region ACT2 may include different types of impurities, and thus, may include different types of transistors. For example, the first active region ACT1 may include a p-channel metal-oxide semiconductor (PMOS) transistor, and the second active region ACT2 may include an n-channel metal-oxide semiconductor (NMOS) transistor.

In an example embodiment of the present inventive concept, at least one of the first and second fin structures 110A and 110B may include a first fin region F1 extending in the first direction X and a second fin region F2 extending in a different direction from the first direction X. As shown in FIG. 1, the first fin structure 110A in the first active region ACT1 may include the first fin region F1 and the second fin region F2.

The second fin region F2 may be disposed between adjacent first fin regions F1 and may connect the first fin regions F1 positioned at different position levels in the second direction Y. The second fin region F2 may not extend in the first direction X and may extend in a direction inclined at a predetermined angle with respect to the first direction X. The first fin structure 110A including such first and second fin regions F1 and F2 may be formed by an extreme ultra-violate (EUV) lithography process.

The semiconductor device 100 includes first contacts 150A and 150B and second contacts 160A and 160B. The first contacts 150A and 150B may respectively be connected to source/drain regions 120A and 120B as shown in FIG. 2. The first contacts 150A and 150B may refer to source/drain contacts. The second contacts 160A and 160B may be connected to a gate structure 130. The second contacts 160A and 160B may refer to gate contacts. As a size of the semiconductor device 100 is reduced and an integration thereof increases, a distance between the first contacts 150A and 150B and the second contacts 160A and 160B may decrease. Thus, a parasitic capacitance between the first contacts 150A and 150B and the second contacts 160A and 160B may increase and a short failure therebetween may be generated due to process failures.

According to an example embodiment of the present inventive concept, since the second fin region F2 is formed in at least one of the first and second fin structures 110A and 110B, the above problem may be solved. That is, as shown in FIG. 1, the first fin structure 110A includes the first fin region F1 and the second fin region F2, and the first fin structure 110A may have a shape with some portion bent in a predetermined direction. Accordingly, the first contact 150A connected to the source/drain region 120A on the second fin region F2 may be positioned at a position level in the second direction Y different from that of the first contact 150A connected to the source/drain region 120A on the first fin region F1. For example, two source/drain regions 120A may be disposed at opposite sides of the gate structure 130, in which the two source/drain regions 120A may be disposed at different position levels in the second direction Y. In addition, the first contact 150A connected to the source/drain region 120A on the second fin region F2 at one side of the gate structure 130 may be positioned at a level in the second direction Y the same as that of the first contact 150A connected to the source/drain region 120A on the second fin region F2 at the other side of the gate structure 130. Thus, the second contact 160A may be connected to the gate structure 130 and may be disposed between the second fin regions F2 in plan view.

The bending shape of the first fin structure 110A may allow the first contact 150A to shift its position in the second direction Y and to move away from the second contact 160A. The first contact 150A on the second fin region F2 and the second contact 160A adjacent thereto may have a reduced facing area (or a reduced lateral overlapping area) therebetween. Accordingly, the short failure in which the first contact 150A is short-circuited with the second contact 160A may be prevented or reduced, and the parasitic capacitance between the first contact 150A and the second contact 160A may be minimized.

The gate structure 130 is divided by a gate separation pattern CT. The gate separation pattern CT may be disposed on the isolation region ISO, and may extend into a lower insulating layer 103 surrounding the first and second fin structures 110A and 110B. The first active region ACT1 and the second active region ACT2 may be defined by an isolation layer 102 in the isolation region ISO. The lower insulating layer 103 may be disposed between the adjacent first fin structures 110A and between the adjacent second fin structures 110B.

The source/drain regions 120A and 120B may be disposed at opposite sides of the gate structure 130, in which the source/drain regions 120A may be disposed on the first active region ACT1, and the source/drain regions 120B may be disposed on the second active region ACT2. The source/drain regions 120A and 120B may have a polygonal shape as shown in FIG. 2, but the present inventive concept is not limited thereto. For example, the source/drain regions 120A and 120B may have various shapes, e.g., a circular shape or a rectangular shape.

The source/drain regions 120A and 120B may be disposed on the first and second fin structures 110A and 110B, respectively, and may have a merged structure or a coupled structure. One or both of the source/drain regions 120A and 120B may be connected to the respective two first and second fin structures 110A and 110B as shown in FIGS. 1 and 2, but the present inventive concept is not limited thereto. For example, the number of the first and second fin structures 110A and 110B connected to respective ones of the source/drain regions 120A and 120B may be variously changed. For example, the source/drain region 120A may be connected to more than two of a plurality of first fin structures 110A, and/or the source/drain region 120B may be connected to more than two of a plurality of second fin structures 110B. Alternatively, the source/drain region 120A may be connected to one first fin structure 110A, and/or the source/drain region 120B may be connected to one second fin structure 110B.

A material forming the source/drain regions 120A and 120B may be changed depending on the kind of the semiconductor device 100. In an example embodiment of the present inventive concept, the PMOS transistor in the first active region ACT1 may include silicon-germanium (SiGe). The NMOS transistor in the second active region ACT2 may include silicon (Si).

The source/drain regions 120A and 120B respectively includes first layers 121A and 121B and second layers 122A and 122B. The first layers 121A and 121B may be respectively grown from the first and second fin structures 110A and 110B. The second layers 122A and 122B may be respectively grown from the first layers 121A and 121B. The source/drain regions 120A and 120B may include n-type impurities or p-type impurities. In an example embodiment of the present inventive concept, the source/drain regions 120A and 120B may include different impurity doping concentrations.

The source/drain regions 120A and 120B may be respectively connected to the first contacts 150A and 150B. The gate structure 130 may be connected to the second contacts 160A and 160B. Referring to FIGS. 2 to 5, the first contacts 150A and 150B respectively includes first contact layers 151A and 151B and second contact layers 152A and 152B. In an example embodiment of the present inventive concept, the first contact layers 151A and 151B may be barrier metal layers as diffusion barriers, and the second contact layers 152A and 152B may be fill metal layers having low electrical resistivity. The first contact layers 151A and 151B may include, e.g., titanium nitride (TiN), tantalum nitride (TaN), and/or tungsten nitride (WN). The second contact layers 152A and 152B may include, e.g., tungsten (W), aluminum (Al), and/or molybdenum (Mo). The second contacts 160A and 160B may respectively have a structure similar to that of the first contacts 150A and 150B, and/or may respectively include a material similar to that of the first contacts 150A and 150B.

In an example embodiment of the present inventive concept, a metal silicide layer 145 may be disposed between each of the source/drain regions 120A and 120B and each of the first contacts 150A and 150B. The metal silicide layer 145 may be formed by reaction between silicon and one of, e.g., titanium (Ti), cobalt (Co), nickel (Ni), tungsten (W), copper (Cu), tantalum (Ta), platinum (Pt), hafnium (Hf), molybdenum (Mo), radium (Ra), and an alloy thereof. The metal silicide layer 145 may be formed on a portion of an upper surface or an entire upper surface, of each of the source/drain regions 120A and 120B, and may be formed by depositing a metal on the source/drain regions 120A and 120B and annealing the metal.

The first contacts 150A and 150B may respectively extend into the source/drain regions 120A and 120B. The source/drain regions 120A and 120B may be respectively formed by epitaxially growing using the first and second fin structures 110A and 110B as a seed. After forming a first interlayer insulating layer 171 on the source/drain regions 120A and 120B, the first interlayer insulating layer 171 may be etched and then the source/drain regions 120A and 120B may be recessed at a predetermined depth, such that a trench may be formed. The first contacts 150A and 150B may be formed by filling the trench with a conductive material. Accordingly, the first contacts 150A and 150B may respectively extend into the source/drain regions 120A and 120B at a predetermined depth.

A second interlayer insulating layer 172 is disposed on the first interlayer insulating layer 171 to cover the first contacts 150A and 150B and the gate structure 130. The first interlayer insulating layer 171 and the second interlayer insulating layer 172 may constitute an interlayer insulating layer 170. In an example embodiment of the present inventive concept, the second contacts 160A and 160B may penetrate the second interlayer insulating layer 172 to connect to the gate structure 130. For example, the second contacts 160A and 160B may be formed by etching the second interlayer insulating layer 172 to form a trench exposing the gate structure 130 and filling the trench with a conductive material. In an example embodiment of the present inventive concept, the second contacts 160A and 160B may be positioned at a higher level than the first contacts 150A and 150B with respect to the upper surface of the semiconductor substrate 101 (see, e.g., the second contact 260A and the first contact 250A of FIG. 8).

Referring to FIG. 2, the first contact 150A connected to the first fin structure 110A including the first and second fin regions F1 and F2 is connected to a power line PL through vias, e.g., a lower via and an upper via V0 and V1, and a circuit pattern P0. Since the first contact 150A may be connected to the source/drain region 120A as shown in FIG. 2, the source/drain region 120A may be connected to the power line PL. The lower and upper vias V0 and V1 and the circuit pattern P0 may be covered by the second interlayer insulating layer 172 and an inter-metal insulating layer IML. For example, the lower via V0 may be disposed in the second interlayer insulating layer 172 and may be positioned at a level the same as that of the second contacts 160A and 160B. The upper via V1 may be disposed in the inter-metal insulating layer IML. In an example embodiment of the present inventive concept, the first fin structure 110A including the first and second fin regions F1 and F2 may be bent toward the power line PL in plan view. The first contact 150A on the second fin region F2 may be closer than the first contact 150A on the first fin region F1 to the power line PL in plan view. Thus, the first contact 150A on the second fin region F2 may be easily connected to the power line PL.

Figure 3:
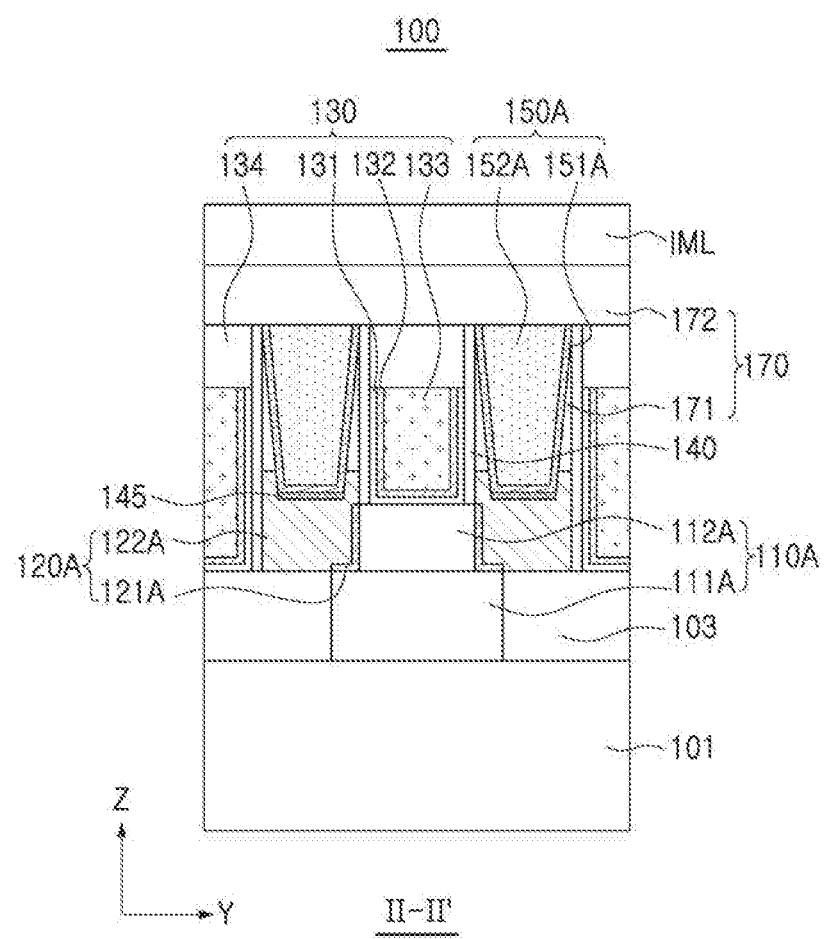
FIG. 3 is a cross-sectional view taken along line II-II' of FIG. 1.
Figure 4:
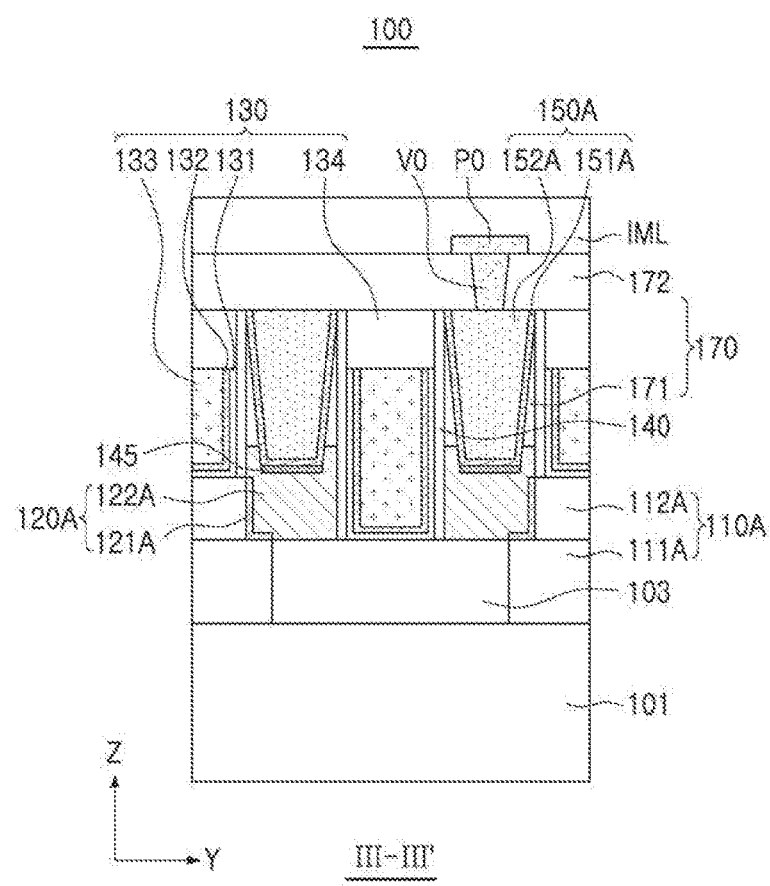
FIG. 4 is a cross-sectional view taken along line III-III' of FIG. 1.
Figure 5:
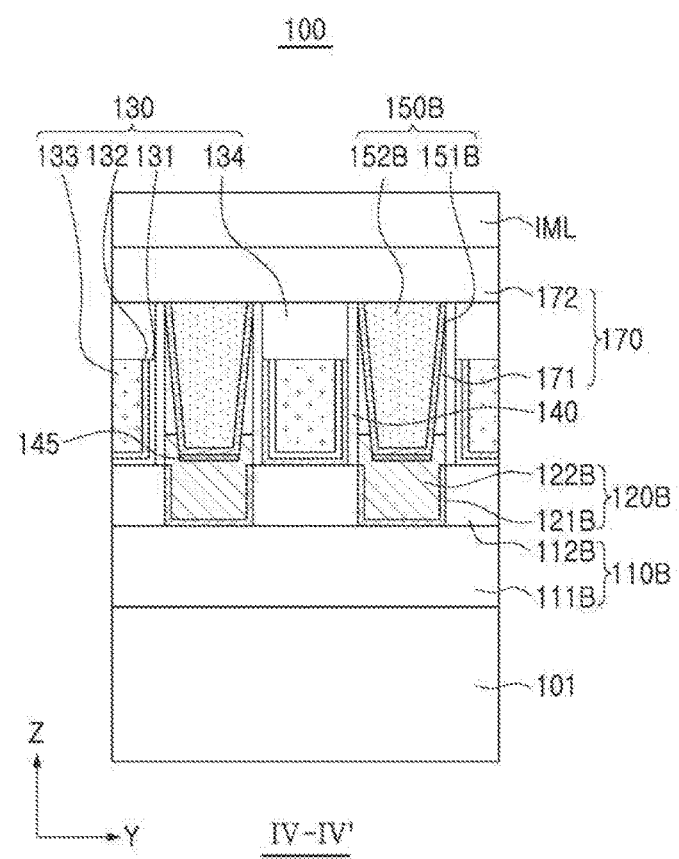
FIG. 5 is a cross-sectional view taken along line IV-IV' of FIG. 1.

Referring to FIGS. 3 to 5, the gate structure 130 includes a gate insulating layer 131, a first gate metal layer 132, a second gate metal layer 133, and a capping layer 134 sequentially stacked on the semiconductor substrate 101. The gate insulating layer 131 may be disposed between the first gate metal layer 132 and each of the first and second fin structures 110A and 110B. The capping layer 134 may be disposed on the gate insulating layer 131, the first gate metal layer 132, and the second gate metal layer 133, and may include an insulating material, e.g., silicon nitride ($Si_3N_4$). A gate spacer 140 is disposed on a sidewall of the gate structure 130, and may also include an insulating material, e.g., silicon oxide ($SiO_2$), silicon nitride ($Si_3N_4$), and/or silicon oxynitride (SiON). The source/drain regions 120A and 120B may be disposed at an outer side of the gate spacer 140.

The first fin structure 110A may include a lower fin region 111A and an upper fin region 112A. The gate structure 130 may cover the upper fin region 112A and may extend in the second direction Y. The upper fin region 112A may be connected to the semiconductor substrate 101 through the lower fin region 11 IA and may serve as a channel region of a transistor included in the semiconductor device.

As described above, the first fin structure 110A may include the first fin region F1 and the second fin region F2. Unlike the first fin region F1 which extends in the first direction X, the second fin region F2 may not extend in the first direction X. Thus, as shown in FIGS. 1, 3 and 4, position levels of the first fin structure 110A in the second direction Y, which is covered by the adjacent gate structures 130 with the second fin region F2 therebetween, may be different from each other. For example, the adjacent two gate structures 130 may overlap the first fin structure 110A at two adjacent first fin regions F1. Thus, the second fin region F2 may be disposed between these two adjacent first fin regions F1 and may connect these two first fin regions F1 which are positioned at different position levels. As shown in FIGS. 1 and 5, in the case of the second fin structure 110B without the second fin region F2, position levels of the second fin structure 110B in the second direction Y, which is covered by the adjacent gate structures 130, may be the same.

The source/drain regions 120A and 120B and the first contacts 150A and 150B may be disposed between the adjacent gate structures 130. In an example embodiment of the present inventive concept, the first contacts 150A and 150B may be at least partially contact the gate spacer 140. Referring to FIGS. 3 to 5, portions of upper sidewalls of the first contacts 150A and 150B may contact a sidewall of the gate spacer 140.

Figure 6:
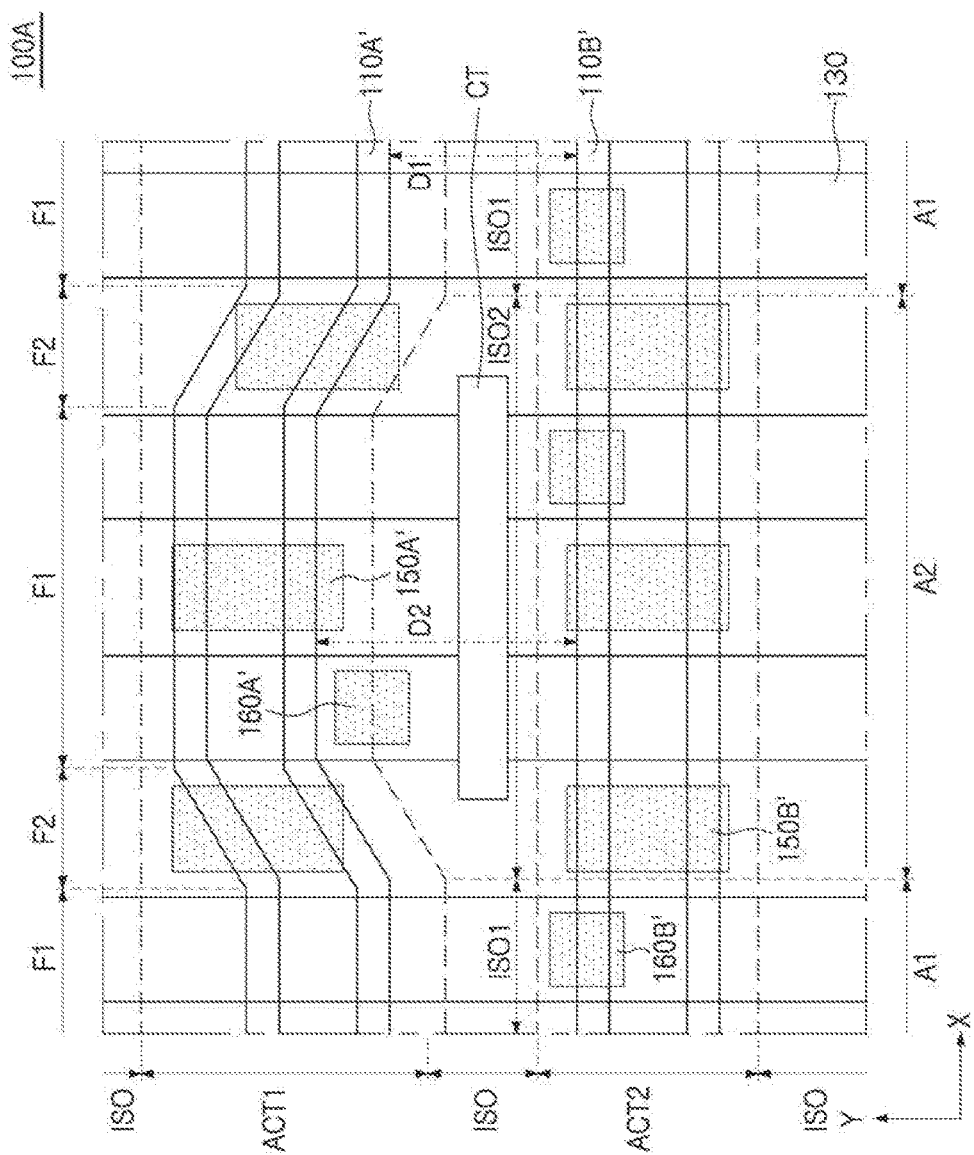
FIG. 6 is a plan view illustrating a semiconductor device according to an example embodiment of the present inventive concept.

FIG. 6 is a plan view illustrating a semiconductor device according to an example embodiment of the present inventive concept.

Referring to FIG. 6, a semiconductor device 100A includes a plurality of fin structures, e.g., first and second fin structures 110A' and 110B', the gate structure 130, and a plurality of contacts 150A', 150B', 160A', and 160B'. In an example embodiment of the present inventive concept, first contacts 150A' and 150B' may be connected to source/drain regions (see, e.g., 120A and 120B of FIG. 2) on the first and second fin structures 110A' and 110B'. The second contacts 160A' and 160B' may be connected to the gate structure 130.

To reduce or prevent a parasitic capacitance or a short failure between the first contacts 150A' and 150B' and the second contacts 160A' and 160B', the first fin structure 110A' may include a slope portion. For example, the slope portion of the first fin structure 110A' may extend in a direction which is different from the first and second directions X and Y and is parallel to the upper surface of the semiconductor substrate (see, e.g., 101 of FIG. 2). That is, the first fin structure 110A' may include the slope portion nonparallel to the first direction X unlike the second fin structure 110B' extending parallel to the first direction X. In an example embodiment of the present inventive concept, the slope portion of the first fin structure 110A' may be disposed in a second region A2 of the semiconductor substrate (see, e.g., 101 of FIG. 2) including a first region A1 and the second region A2. For example, the first fin structure 110A' and the second fin structure 110B' may be spaced apart from each other in the second direction Y parallel to an upper surface of the semiconductor substrate (see, e.g., 101 of FIG. 2), in the first region A1 and the second region A2. In the first region A1, the first fin structure 110A' and the second fin structure 110B' may extend in the first direction X intersecting the second direction Y and parallel to the upper surface of the semiconductor substrate (see, e.g., 101 of FIG. 2). In the second region A2, at least one of the source/drain regions (see, e.g., 120A of FIG. 2) is disposed on the slope portion of the first fin structure 110A'.

In an example embodiment of the present inventive concept, the first fin structure 110A' including the first and second fin regions F1 and F2 may be bent toward the power line (see, e.g., PL of FIG. 2) in the second region A2, in plan view. For example, the first fin region F1 of the first fin structure 110A' in the second region A2 may be closer to the power line (see, e.g., PL of FIG. 2) than the first fin region F1 of the first fin structure 110A' in the first region A1, in plan view.

A distance between the first fin structure 110A' and the second fin structure 110B' that are adjacent to each other in the first region A1 may be smaller than a distance between the first fin structure 110A' and the second fin structure 110B' that are adjacent to each other in the second region A2. In FIG. 6, the distance between the adjacent first and second fin structures 110A' and 110B' in the first region A1 may be defined as D1, and the distance between the adjacent first and second fin structures 110A' and 110B' in the second region A2 may be defined as D2. The distance D2 may have different values depending on the location. The distance D2 may have a value greater than that of the distance D1, as shown in FIG. 6.

The isolation region ISO may be disposed between the first fin structure 110A' and the second fin structure 110B'. The isolation region ISO may be formed by etching a portion of the semiconductor substrate (see, e.g., 101 of FIG. 2) to form a trench and filling the trench with an insulating material. The isolation region ISO may have a shape corresponding to the first fin structure 110A' and the second fin structure 110B'. The isolation region ISO may include a first isolation region ISO1 and a second isolation region ISO2 that are connected to each other in the first direction X, and the first isolation region ISO1 and the second isolation region ISO2 may have different widths in the second direction Y. The first isolation region ISO1 and the second isolation region ISO2 may correspond to the first region A1 and the second region A2, respectively. In an example embodiment of the present inventive concept, a width of the second isolation region ISO2 in the second direction Y may be greater than a width of the first isolation region ISO1 in the second direction Y. This is because the second isolation region ISO2 is formed adjacent to the second fin region F2 of the first fin structure 110A'. Similar to the distance D2, the width of the second isolation region ISO2 in the second direction Y may have different values depending on the location.

The second contact 160A' may be disposed between the first fin structure 110A' and the second fin structure 110B' in the second region A2, in plan view. Since the isolation region ISO has the shape corresponding to the first fin structure 110A' and the second fin structure 110B', at least a portion of the second contact 160A' connected to the gate structure 130 may be disposed on (or, in plan view, overlap) the isolation region ISO (e.g., the second isolation region ISO2). The second contact 160A' may be disposed on a boundary between the isolation region ISO and an active region defined by the isolation region ISO. A portion of the second contact 160A' may be disposed on the active region and the other portion may be disposed on the isolation region ISO. In an example embodiment of the present inventive concept, the second contact 160A' of which at least a portion is disposed on the isolation region ISO may be included in the second region A2.

Figure 7:
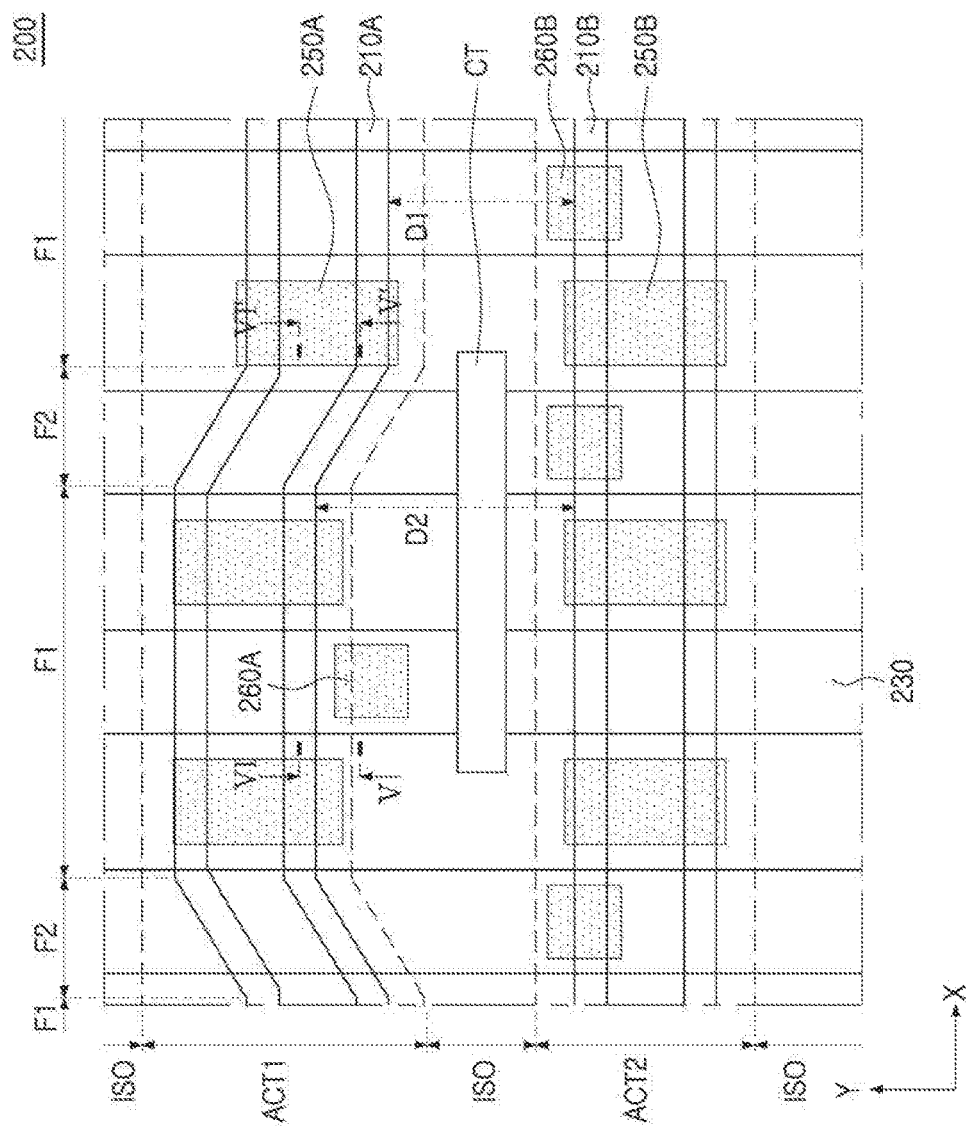
FIG. 7 is a plan view illustrating a semiconductor device according to an example embodiment of the present inventive concept.
Figure 8:
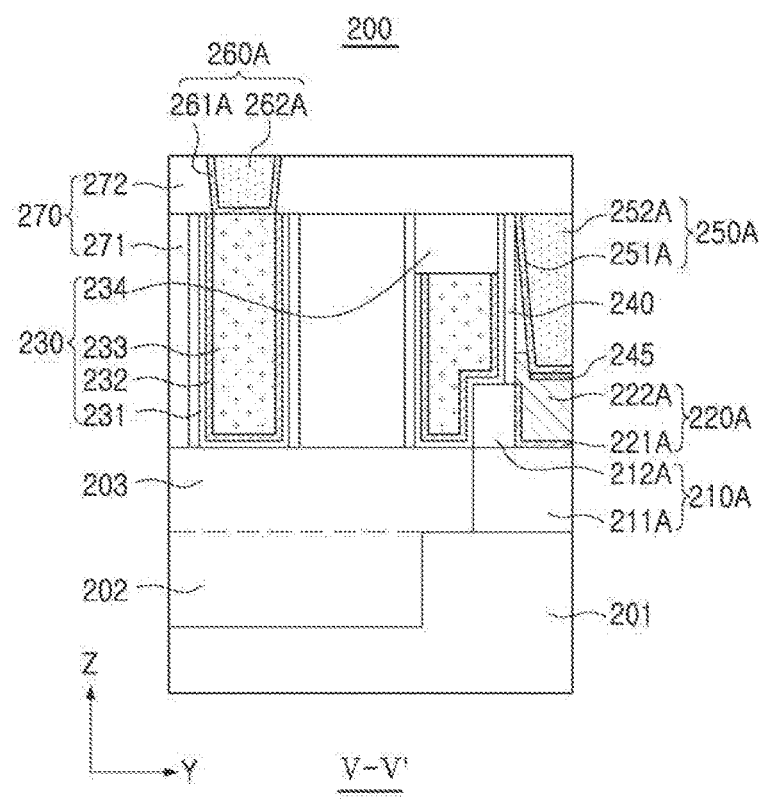
FIG. 8 is a cross-sectional view taken along line V-V' of FIG. 7.
Figure 9:
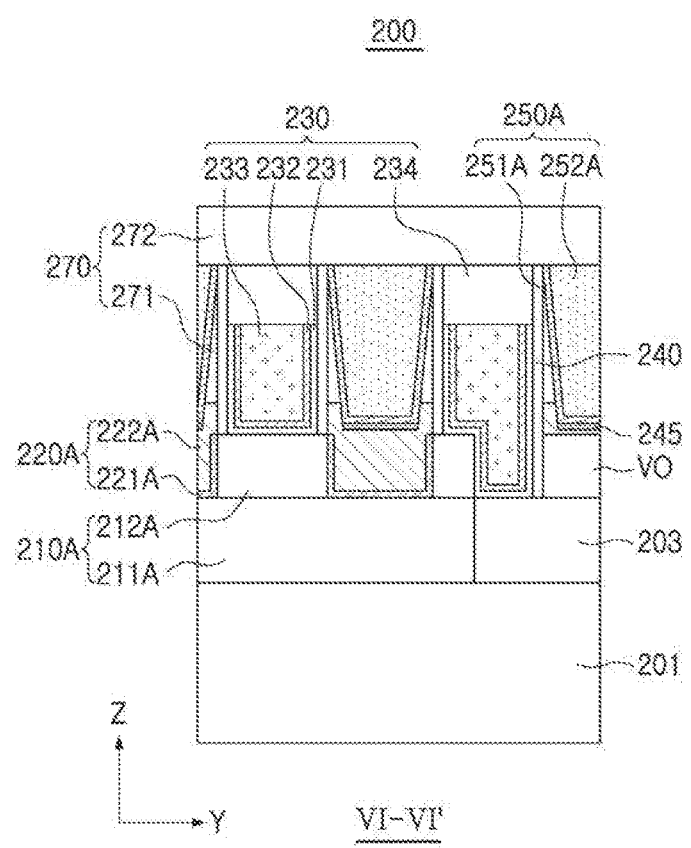
FIG. 9 is a cross-sectional view taken along line VI-VI' of FIG. 7.

FIG. 7 is a plan view illustrating a semiconductor device according to an example embodiment of the present inventive concept. FIG. 8 is a cross-sectional view taken along line V-V' of FIG. 7. FIG. 9 is a cross-sectional view taken along line VI-VI' of FIG. 7.

Referring to FIG. 7, a semiconductor device 200 includes a plurality of fin structures, e.g., first and second fin structures, 210A and 210B, and a plurality of contacts 250A, 250B, 260A, and 260B. In an example embodiment of the present inventive concept, first contacts 250A and 250B may respectively be connected to source/drain regions (see, e.g., 120A and 120B of FIG. 2) on the first and second fin structures 210A and 210B. The second contacts 260A and 260B may be connected to a gate structure 230.

The first fin structure 210A includes the first fin region F1 and the second fin region F2. The second fin region F2 may connect spaced first fin regions F1 which are positioned at different position levels. The first fin region F1 may extend in the first direction X. The second fin region F2 may extend in a direction different from the first direction X. The second fin region F2 may extend in a direction sloped at a predetermined angle with respect to the first direction X, and may be covered by the gate structure 230.

The first fin structure 210A and the second fin structure 210B may have different types of impurities and each may serve as a channel region of a PMOS transistor and/or an NMOS transistor. The isolation region ISO may be disposed between the first fin structure 210A and the second fin structure 210B, and may have a shape corresponding to the first fin structure 210A and the second fin structure 210B. Since the first fin structure 210A includes the first fin region F1 and the second fin region F2, a distance between the first fin structure 210A and the second fin structure 210B that are adjacent to each other with the isolation region ISO therebetween may not be constant.

The distance between the first fin structure 210A and the second fin structure 210B may be varied from D1 to D2. The reason is that the first fin structure 210A and the second fin structure 210B are not parallel to each other in the second fin region F2. In a region in which the distance between the first fin structure 210A and the second fin structure 210B is D2, the first contact 250A and the second contact 260A may not face each other or may have a reduced facing area (or a reduced lateral overlapping area) therebetween. Thus, a short failure between the first contact 250A and the second contact 260A may be reduced or prevented, and a parasitic capacitance therebetween may also be minimized.

Referring to FIGS. 8 and 9, the gate structure 230 includes a gate insulating layer 231, a first gate metal layer 232, a second gate metal layer 233, and a capping layer 234 sequentially stacked on a substrate 201. A gate spacer 240 may be disposed on a sidewall of the gate structure 230, and may include an insulating material. The first fin structure 210A includes a lower fin region 211A and an upper fin region 212A. The upper fin region 212A may be covered by the gate structure 230 and may serve as a channel region. The lower fin region 211A may be surrounded by a lower insulating layer 203. A trench formed in the substrate 201 may be filled with an insulating material to form an isolation layer 202.

Referring to FIG. 8, the capping layer 234 may not be disposed in a region in which the gate structure 230 is connected to the second contact 260A. To form the capping layer 234, the gate spacer 240 may be previously formed, and then the gate insulating layer 231 and the first and second gate metal layers 232 and 233 may be filled in a space between opposite gate spacers 240. Thereafter, portions of the gate insulating layer 231 and the first and second gate metal layers 232 and 233 may be removed to form a recess, and then the recess may be filled with an insulating material, e.g., silicon nitride ($Si_3N_4$), to form the capping layer 234.

To simplify a process of connecting the second contact 260A to the gate structure 230, the gate insulating layer 231 and the first and second gate metal layers 232 and 233 may not be removed in the region in which the first and second gate metal layers 232 and 233 are connected to the second contact 260A. Accordingly, a portion of the gate structure 230 may not include the capping layer 234.

A source/drain region 220A includes a first layer 221A and a second layer 222A. The first layer 221A may be a layer grown from the first fin structure 210A. The second layer 222A may be grown from the first layer 221A. The second layers 222A formed from different first fin structures 210A may be coupled or merged with each other in the second direction Y to form a single source/drain region 220A.

The source/drain region 220A and the gate structure 230 may be covered by the first interlayer insulating layer 271 and the second interlayer insulating layer 272. The second interlayer insulating layer 272 may be disposed on the first interlayer insulating layer 271 to cover the first contact 250A and the gate structure 230. The first contact 250A may penetrate the first interlayer insulating layer 271, and may be connected to the source/drain region 220A. The second contact 260A may penetrate the second interlayer insulating layer 272, and may be connected to the gate structure 230 intersecting the first fin region F1 between the adjacent second fin regions F2. In an example embodiment of the present inventive concept, the second contact 260A may be positioned at a level higher than that of the first contact 250A with respect to the upper surface of the substrate 201 as shown in FIG. 8. The first contact 250A may not be disposed at opposite sides of the second contact 260A (or not laterally overlap the second contact 260A), as shown in FIG. 7. This is because the source/drain region 220A is disposed at a relatively different position level in the second direction Y by the shape of the first fin structure 210A.

The bending shape of the first fin structure 210A may allow the first contact 250A to shift its position in the second direction Y and to move away from the second contact 260A. The first contact 250A and the second contact 260A may be positioned at different position levels in the second direction Y, and thus, the first contact 250A may not be disposed at the opposite sides of the second contact 260A. Accordingly, the short failure between the first contact 250A and the second contact 260A may not occur, and the parasitic capacitance therebetween may be prevented.

Referring to FIG. 9, a void VO may be formed below the source/drain region 220A between the adjacent first fin structures 210A. In an example embodiment of the present inventive concept, a portion of the void VO may be filled by the interlayer insulating layer 270.

Figure 10:
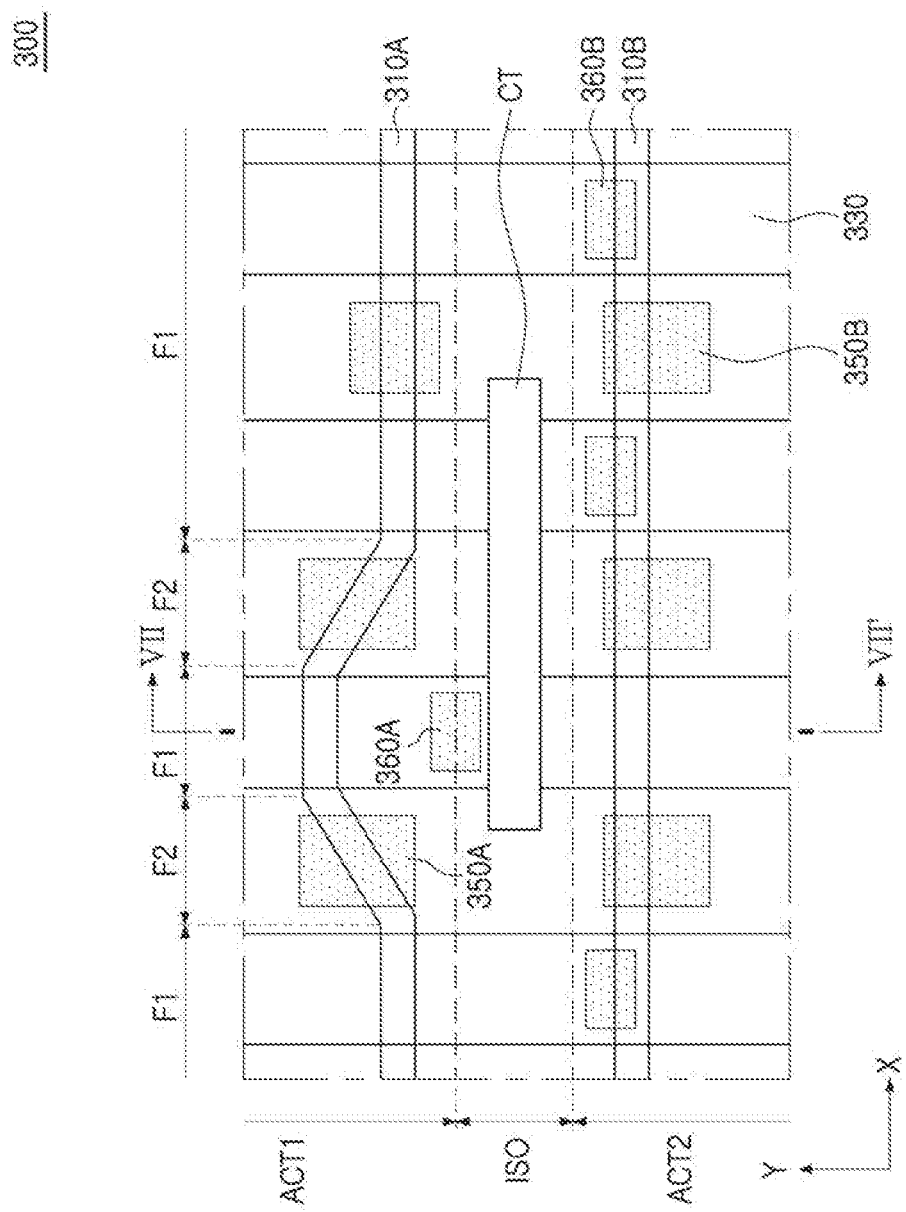
FIG. 10 is a plan view illustrating a semiconductor device according to an example embodiment of the present inventive concept.
Figure 11:
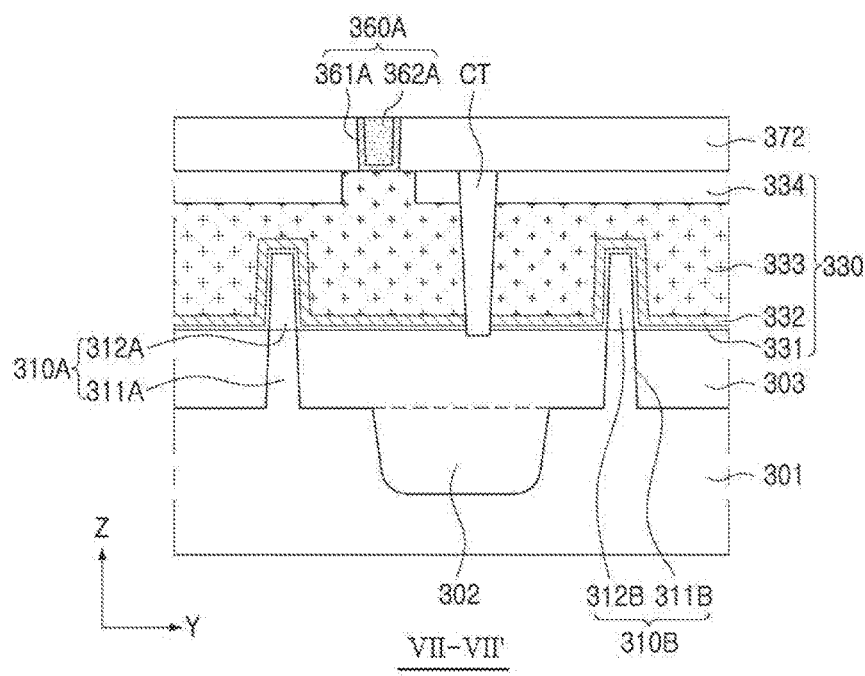
FIG. 11 is a cross-sectional view taken along line VII-VII' of FIG. 10.

FIG. 10 is a plan view illustrating a semiconductor device according to an example embodiment of the present inventive concept. FIG. 11 is a cross-sectional view taken along line VII-VII' of FIG. 10.

Referring to FIG. 10, a semiconductor device 300 includes a plurality of fin structures, e.g., first and second fin structures 310A and 310B, a gate structure 330, and a plurality of contacts 350A, 350B, 360A and 360B. In an example embodiment of the present inventive concept, first contacts 350A and 350B may be connected to source/drain regions (see, e.g., 120A and 120B of FIG. 2, but the number of first and second fin structures 310A and 310B illustrated in FIG. 10 may be different) on the first and second fin structures 310A and 310B. The second contacts 360A and 360B may be connected to the gate structure 330. In the semiconductor device 300 according to an example embodiment of the present inventive concept, each of the first fin structure 310A and the second fin structure 310B is a single fin structure.

The first fin structure 310A may include the first fin region F1 extending in the first direction X and the second fin region F2 extending in a direction that is different from the first direction X. Referring to FIG. 10, the second fin region F2 may extend in a direction sloped at a predetermined angle with respect to the first direction X. A source/drain region (see, e.g., 120A of FIG. 2) may be disposed on the second fin region F2, and the first contact 350A may be disposed on the source/drain region (see, e.g., 120A of FIG. 2), but the present inventive concept is not limited thereto. For example, in an example embodiment of the present inventive concept, the gate structure 330 may intersect the second fin region F2, and the source/drain region (see, e.g., 120A of FIG. 2) may be disposed on the first fin region F1. For example, the gate structure 330 may intersect at least one of the second fin regions F2 of the first fin structure 310A.

The first fin structure 310A and the second fin structure 310B may include different types of impurities and each may serve as a channel region of a PMOS transistor and/or an NMOS transistor. In an example embodiment of the present inventive concept, the isolation region ISO may be disposed to separate the first fin structure 310A and the second fin structure 310B. The isolation region ISO may include an isolation layer 302 (see FIG. 11).

Referring to FIG. 11, the isolation layer 302 may be formed by filling a trench formed in a substrate 301 with an insulating material. The first and second fin structures 310A and 310B may each include a corresponding one of lower fin regions 311A and 311B and a corresponding one of upper fin regions 312A and 312B. The lower fin regions 311A and 311B may be surrounded by a lower insulating layer 303. The upper fin regions 312A and 312B may be covered by the gate structure 330 and may serve as channel regions of transistors included in the semiconductor device 300.

The gate structure 330 includes a gate insulating layer 331, a first gate metal layer 332, a second gate metal layer 333, and a capping layer 334 sequentially stacked on the substrate 301. The first gate metal layer 332 may be a barrier metal layer as a diffusion barrier. The second gate metal layer 333 may be a fill metal layer having low electrical resistivity. The capping layer 334 may include a material different from that of a second interlayer insulating layer 372 thereon. For example, the capping layer 334 may include silicon nitride ($Si_3N_4$), and the second interlayer insulating layer 372 may include silicon oxide ($SiO_2$).

As described above, the capping layer 334 may not be disposed in a region in which the first and second gate metal layers 332 and 333 are connected to the second contact 360A. Thus, referring to FIG. 11, the capping layer 334 may not be formed in at least a region along the second direction Y. An upper surface of the second gate metal layer 333 below the second contact 360A may be coplanar with an upper surface of the capping layer 334.

The second contact 360A may include a first contact layer 361A as a barrier metal layer and a second contact layer 362A as a fill metal layer. The first contact layer 361A and the second contact layer 362A of the second contact 360A may include structures and materials the same as or similar to those of the first contact layer 151A and the second contact layer 152A of the first contact 150A described above. In an example embodiment of the present inventive concept, referring to FIGS. 10 and 11, a portion of the second contact 360A may overlap the isolation region ISO (or vertically overlap the isolation layer 302). The bending shape of the first fin structure 310A may allow the first contact 350A to shift its position in the second direction Y and to move away from the second contact 360A. The first contact 350A on the second fin region F2 and the second contact 360A adjacent thereto may have a reduced or no facing area (or a reduced or no lateral overlapping area) therebetween. Accordingly, the short failure in which the first contact 350A is short-circuited with the second contact 360A may be prevented or reduced, and the parasitic capacitance between the first contact 350A and the second contact 360A may be minimized.

FIGS. 12 to 28 illustrate a method of manufacturing a semiconductor device according to an example embodiment of the present inventive concept. FIGS. 12, 13, 15, 17, 19, 21, 23, and 26 are plan views. FIGS. 14, 16, 18, 20, 22, 24, 25, 27, and 28 are cross-sectional views taken along lines VIII-VIII', IX-IX', X-X', XI'-XI', XII-XII', XIII-XIII' XIV-XIV', XV-XV', and XVI-XVI' of FIGS. 13, 15, 17, 19, 21, 23 and 26, respectively.

Figure 12:
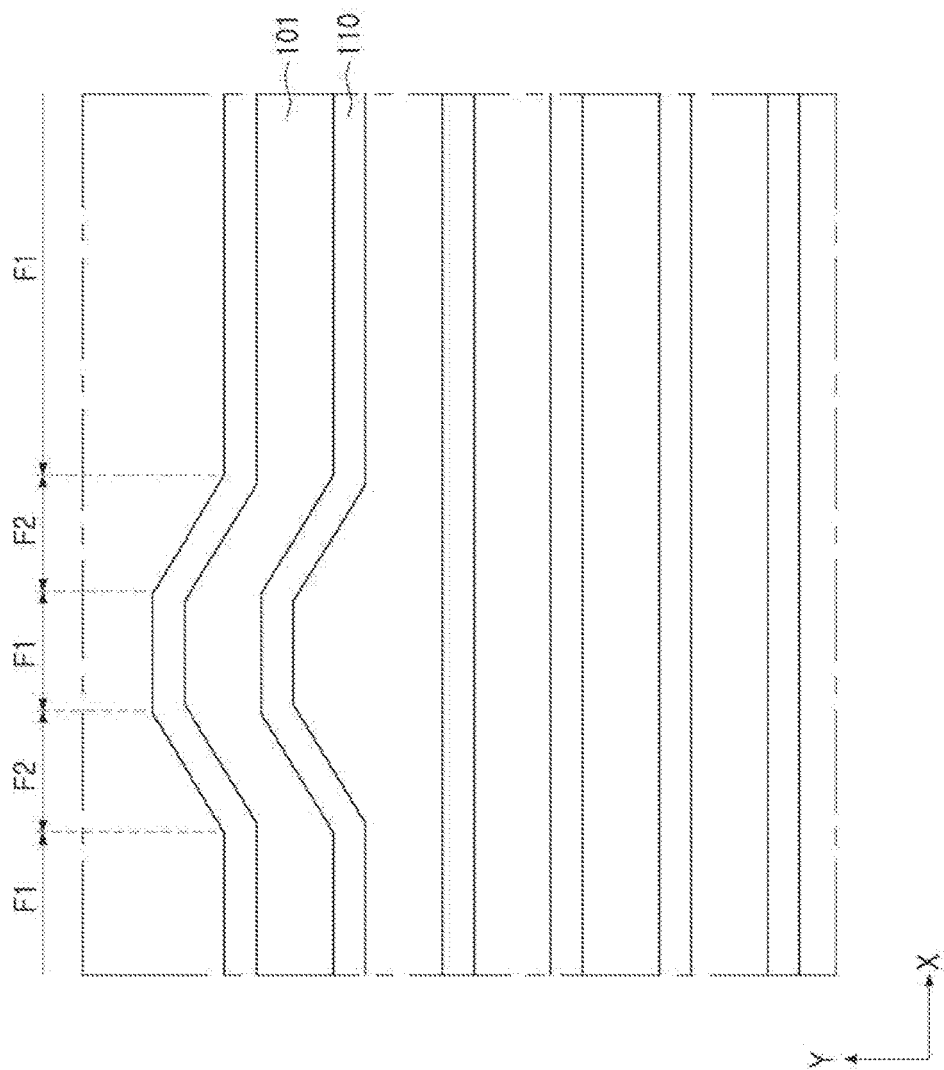
FIGS. 12 to 28 illustrate a method of manufacturing a semiconductor device according to an example embodiment of the present inventive concept.

Referring to FIG. 12, the semiconductor substrate 101 is patterned to form a plurality of fin structures 110. To pattern the plurality of fin structures 110, an EUV lithography process and/or a conventional lithography process such as, an ArF (193 nm) deep UV (DUV) immersion lithography process may be used. The fin structures 110 may be formed to provide a channel region and source/drain regions of a semiconductor transistor, and may include the first fin region F1 extending in the first direction X. At least one of the fin structures 110 may further include the second fin region F2 not extending in the first direction X. The first fin region F1 and the second fin region F2 may linearly extend as shown in FIG. 12, but the present inventive concept is not limited thereto. For example, the first fin region F1 and the second fin region F2 may be curvedly connected at a boundary therebetween.

Figure 13:
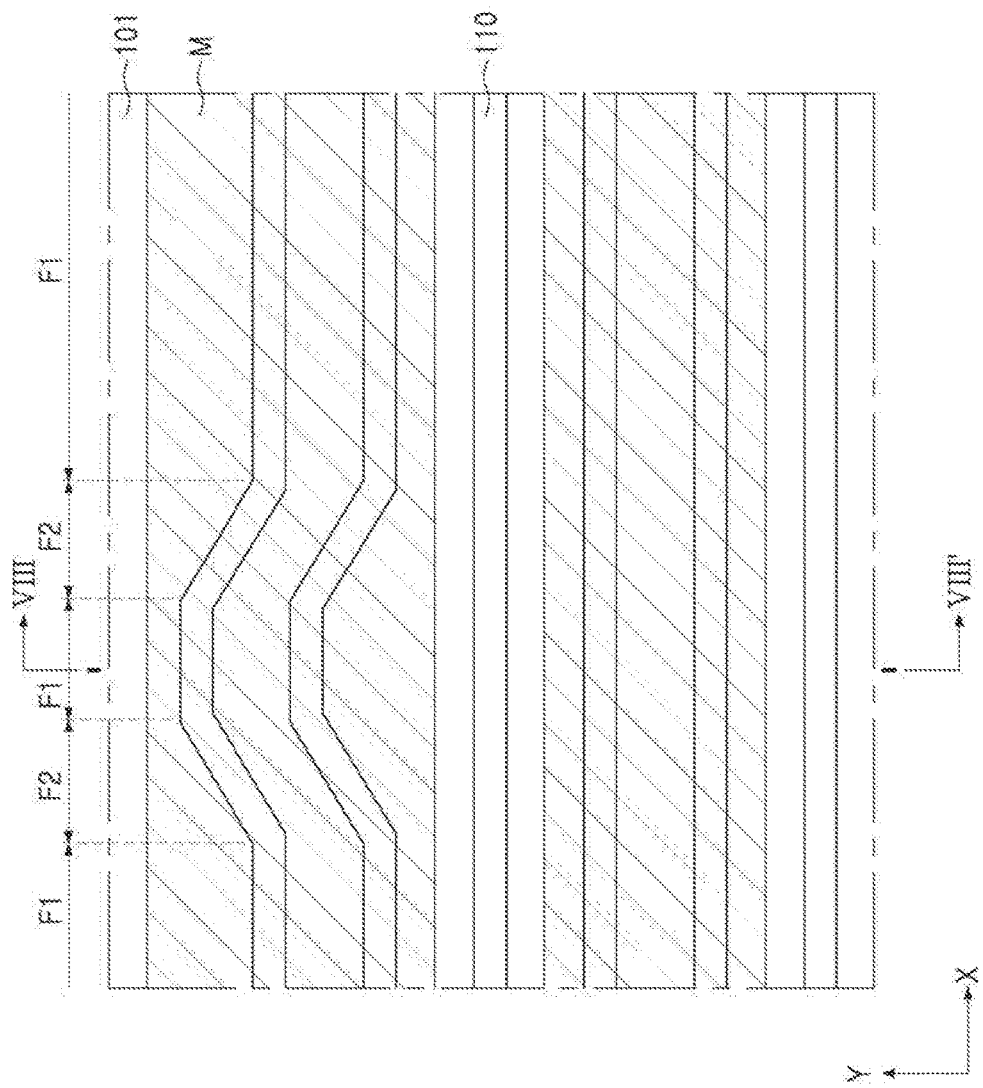
Figure 14:
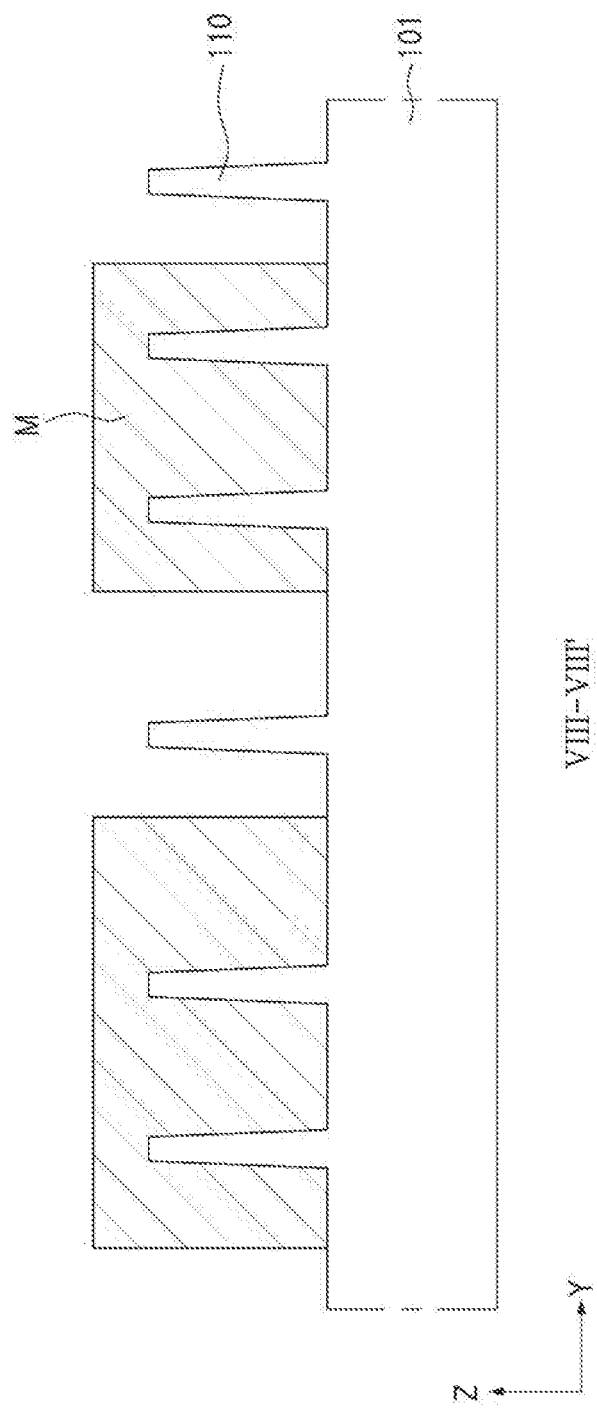

Referring to FIGS. 13 and 14, a mask layer M is formed to cover some of the fin structures 110. The mask layer may be formed by a photolithography process. The mask layer M may cover some of the fin structures 110 and may expose the other ones of the fin structures 110.

Figure 15:
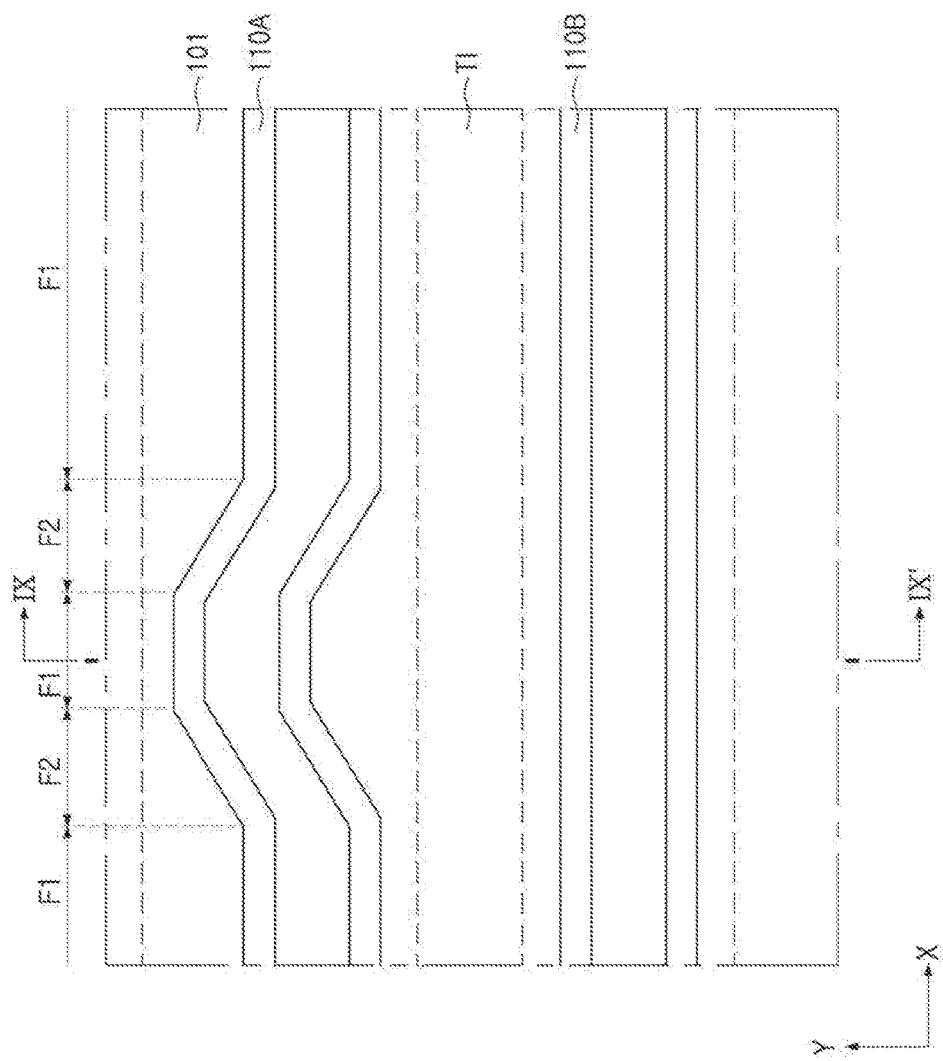
Figure 16:
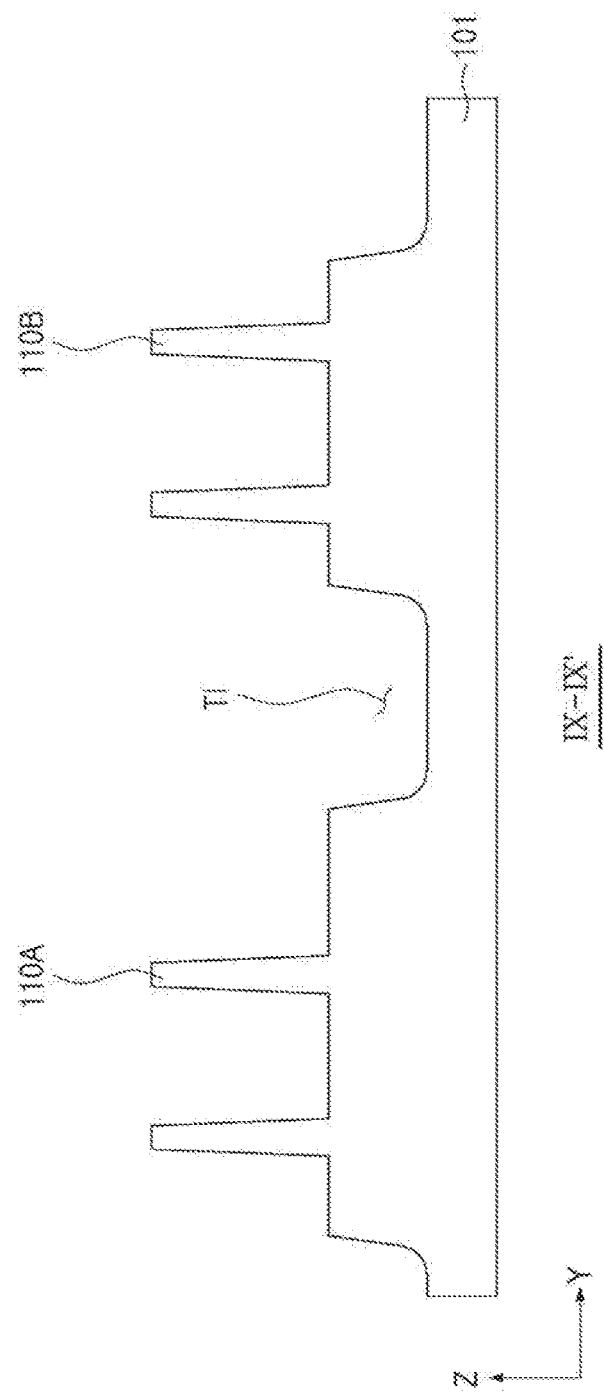

Referring to FIGS. 15 and 16, an etching process are performed using the mask layer M as an etch mask to remove the fin structures 110 except for the first fin structures 110A and the second fin structures 110B. The etching process may be a reactive ion etching (RIE) process. At this time, a portion of the semiconductor substrate 101 may also be removed to form a trench TI as shown in FIG. 16. The mask layer M may then be removed after the etching process.

Figure 17:
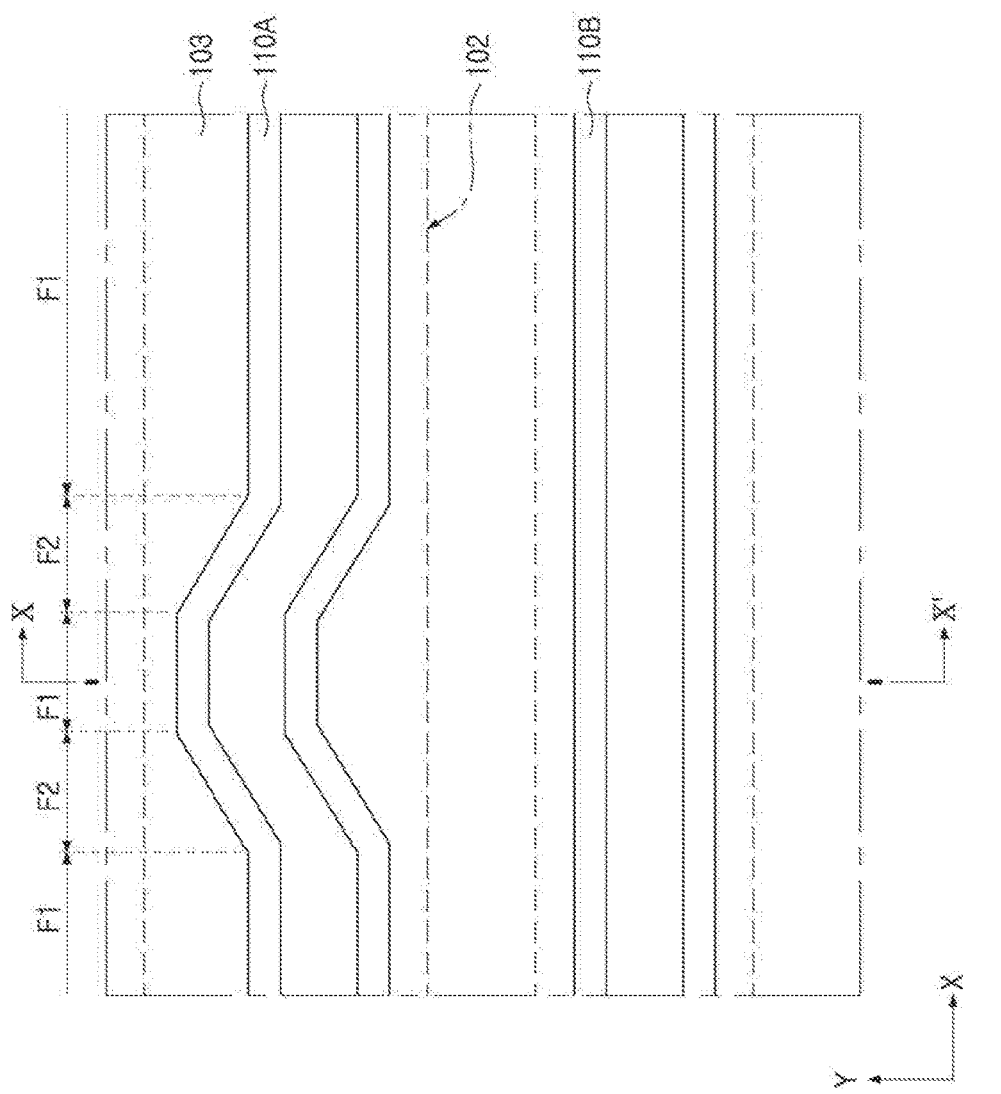
Figure 18:
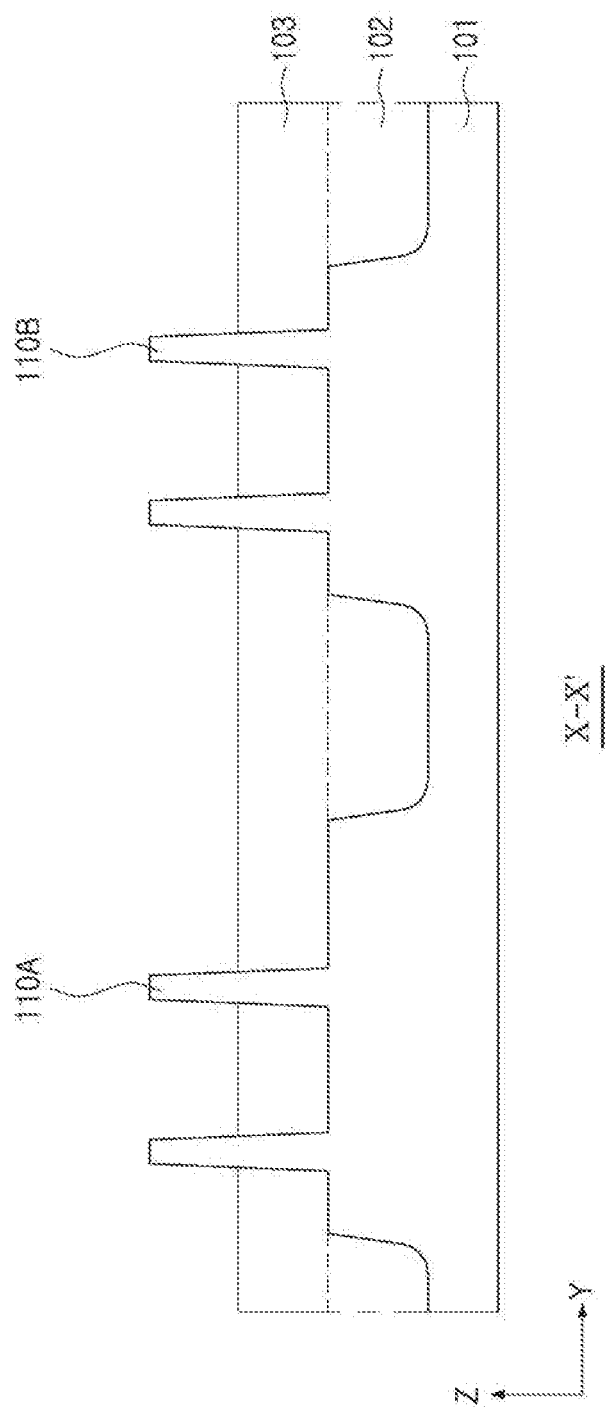

Referring to FIGS. 17 and 18, an insulating material may be deposited on the semiconductor substrate 101 to expose a portion of each of the first and second fin structures 110A and 110B. Thus, an isolation layer 102 is formed to fill the trench T1, and a lower insulating layer 103 is formed to surround at least some of the first and second fin structures 110A and 110B. The isolation layer 102 and the lower insulating layer 103 may include, e.g., silicon oxide ($SiO_2$).

Figure 19:
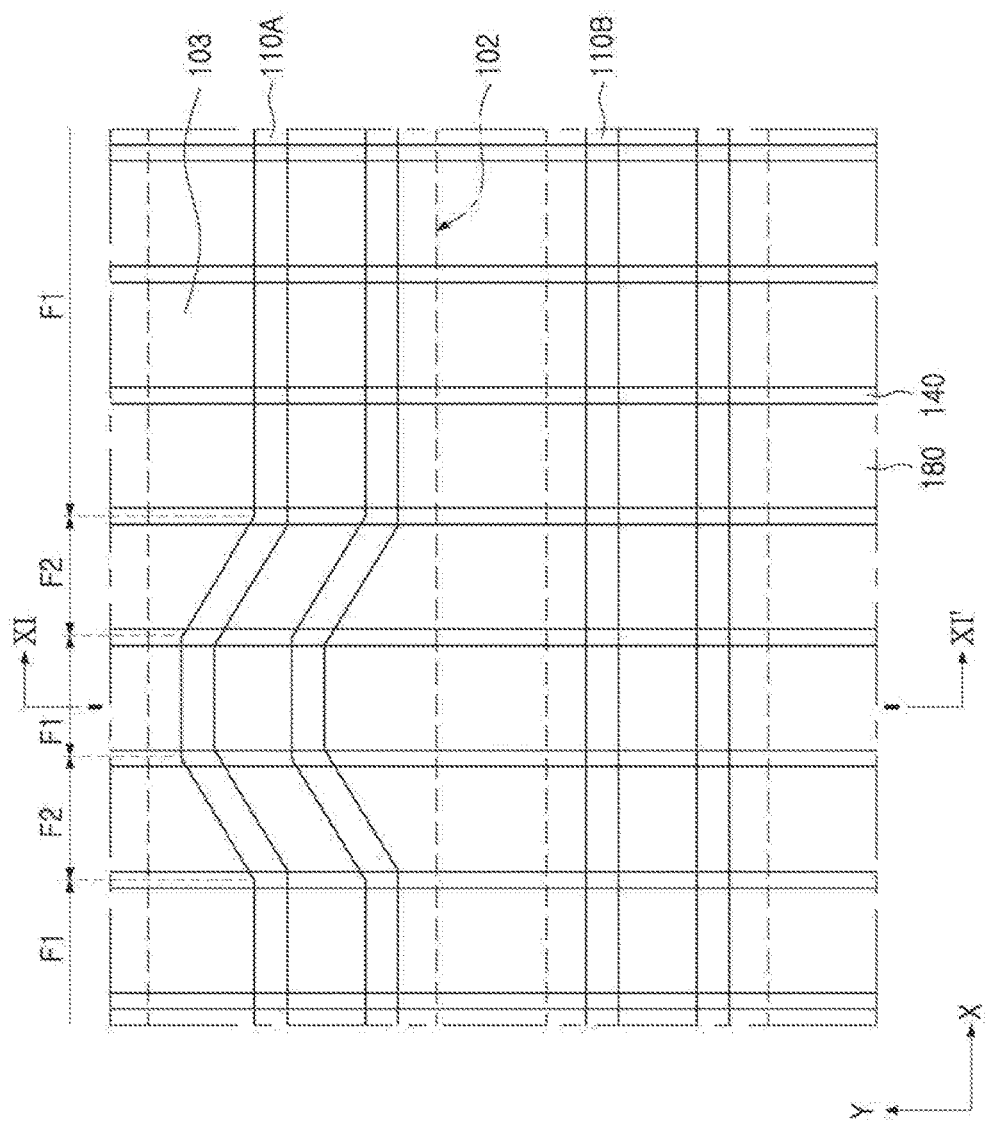
Figure 20:
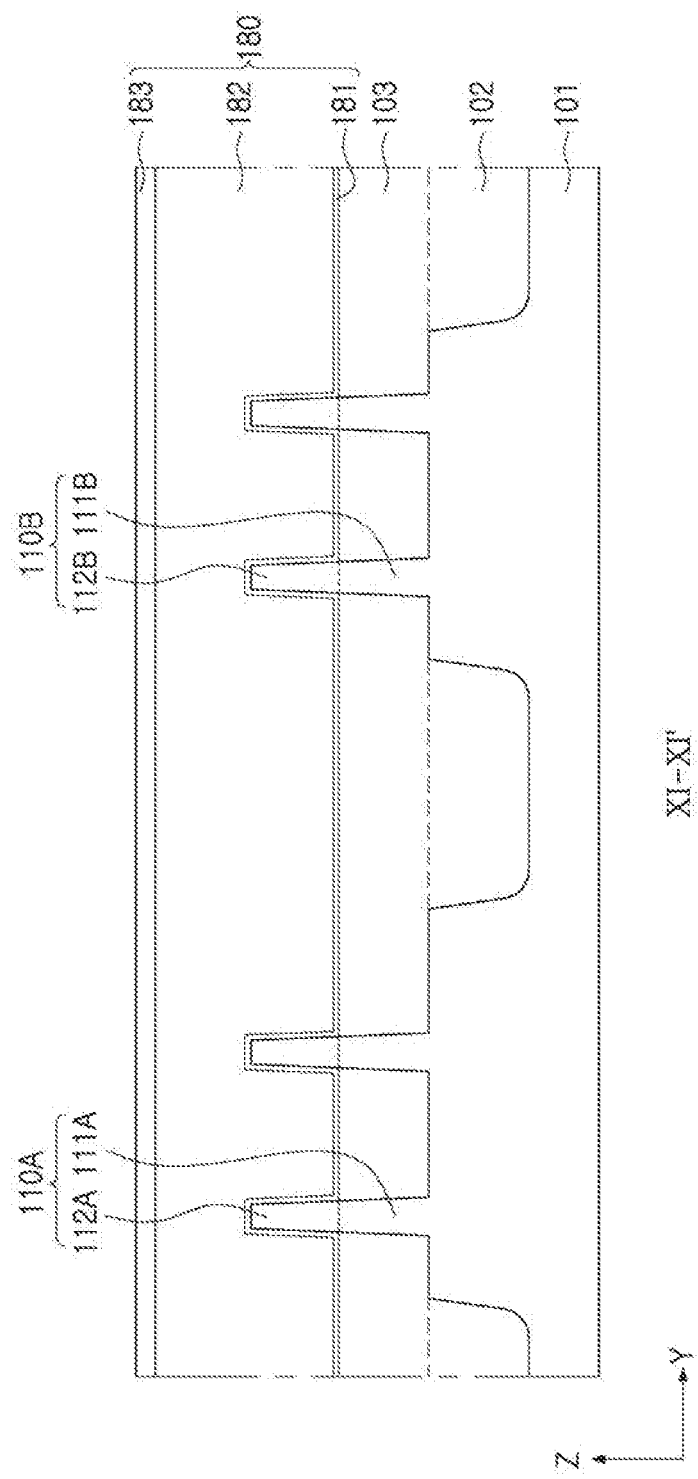

Referring to FIGS. 19 and 20, a dummy gate structure 180 and a gate spacer 140 are formed to intersect the first and second fin structures 110A and 110B. The dummy gate structure 180 and the gate spacer 140 may extend in the second direction Y and cover a portion of each of the first and second fin structures 110A and 110B. The dummy gate structure 180 may include a dummy gate insulating layer 181, a dummy gate layer 182, and a mask pattern layer 183. The dummy gate insulating layer 181 may include, e.g., silicon oxide ($SiO_2$). The dummy gate layer 182 may include, e.g., polysilicon.

The gate spacer 140 may be formed by, after forming an insulating material on the dummy gate structure 180, the first and second fin structures 110A and 110B, and the lower insulating layer 103, performing an anisotropic etching process, e.g., RIE process, thereon. The gate spacer 140 may include, e.g., silicon oxide ($SiO_2$), silicon nitride ($Si_3N_4$), and/or silicon oxynitride (SiON).

Figure 21:
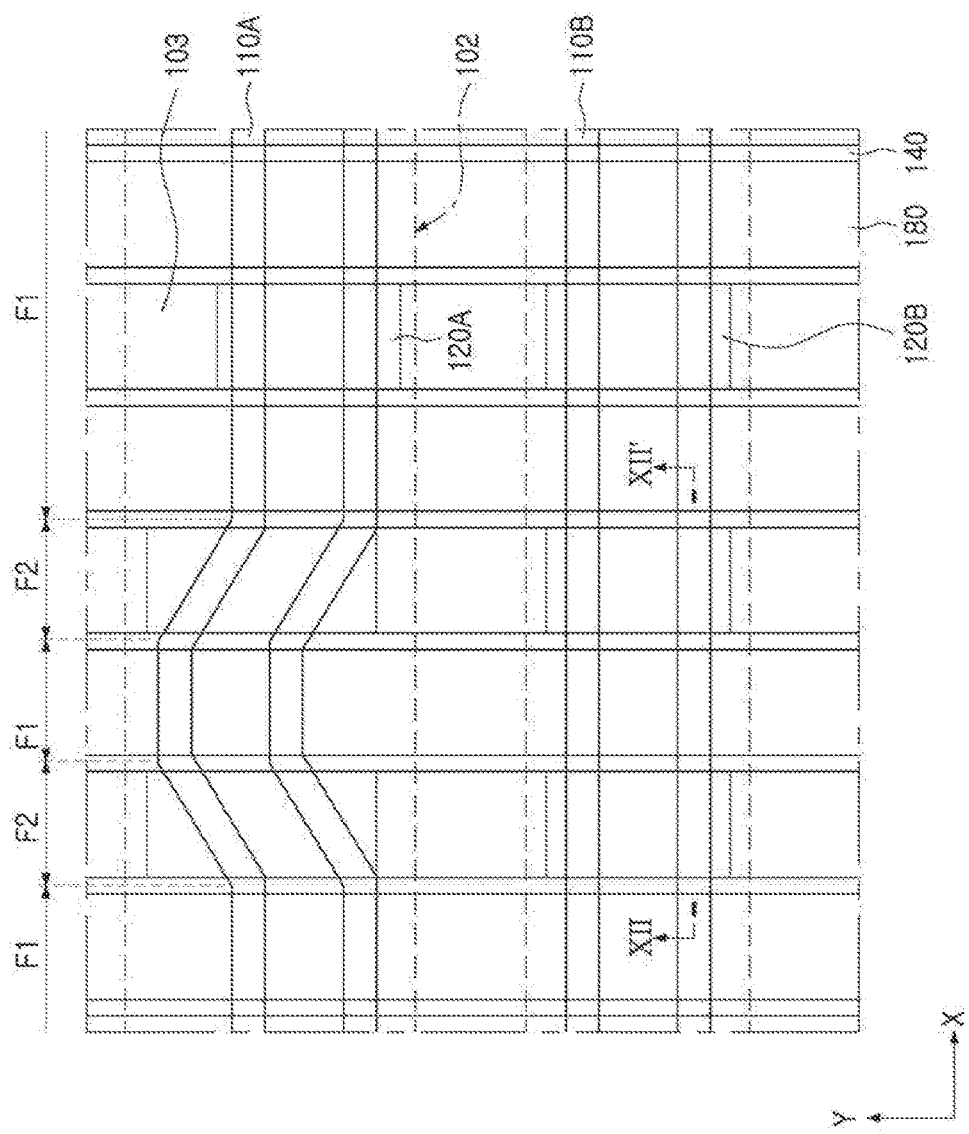
Figure 22:
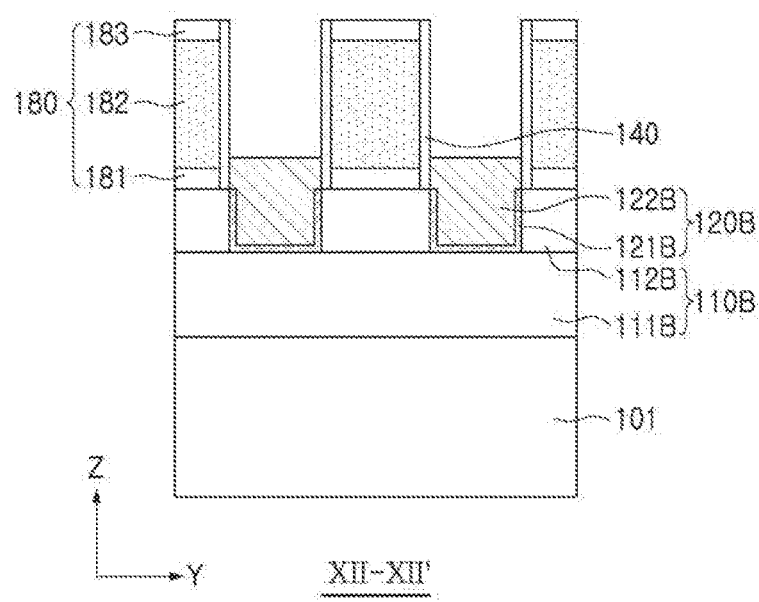

Referring to FIGS. 21 and 22, the source/drain regions 120A and 120B may be respectively formed from the first and second fin structures 110A and 110B exposed between the adjacent gate spacers 140. After forming the dummy gate structure 180 and the gate spacer 140, the first and second fin structures 110A and 110B at outer sides of the gate spacers 140 may be selectively removed to form recess regions. The recess regions may be formed by etching the first and second fin structures 110A and 110B using an additional mask, or the mask pattern layer 183 and the gate spacer 140, as an etch mask. After forming the recess regions, a curing process may be optionally performed on surfaces of the recessed first and second fin structures 110A and 110B.

The source/drain regions 120A and 120B may be formed by performing a selective epitaxial growth (SEG) process using the recessed first and second fin structures 110A and 110B as a seed. The source/drain regions 120A and 120B may include a semiconductor layer doped with impurities. In an example embodiment of the present inventive concept, the source/drain regions 120A and 120B may include or be formed of, e.g., silicon (Si) or silicon germanium (SiGe) doped with impurities.

Figure 23:
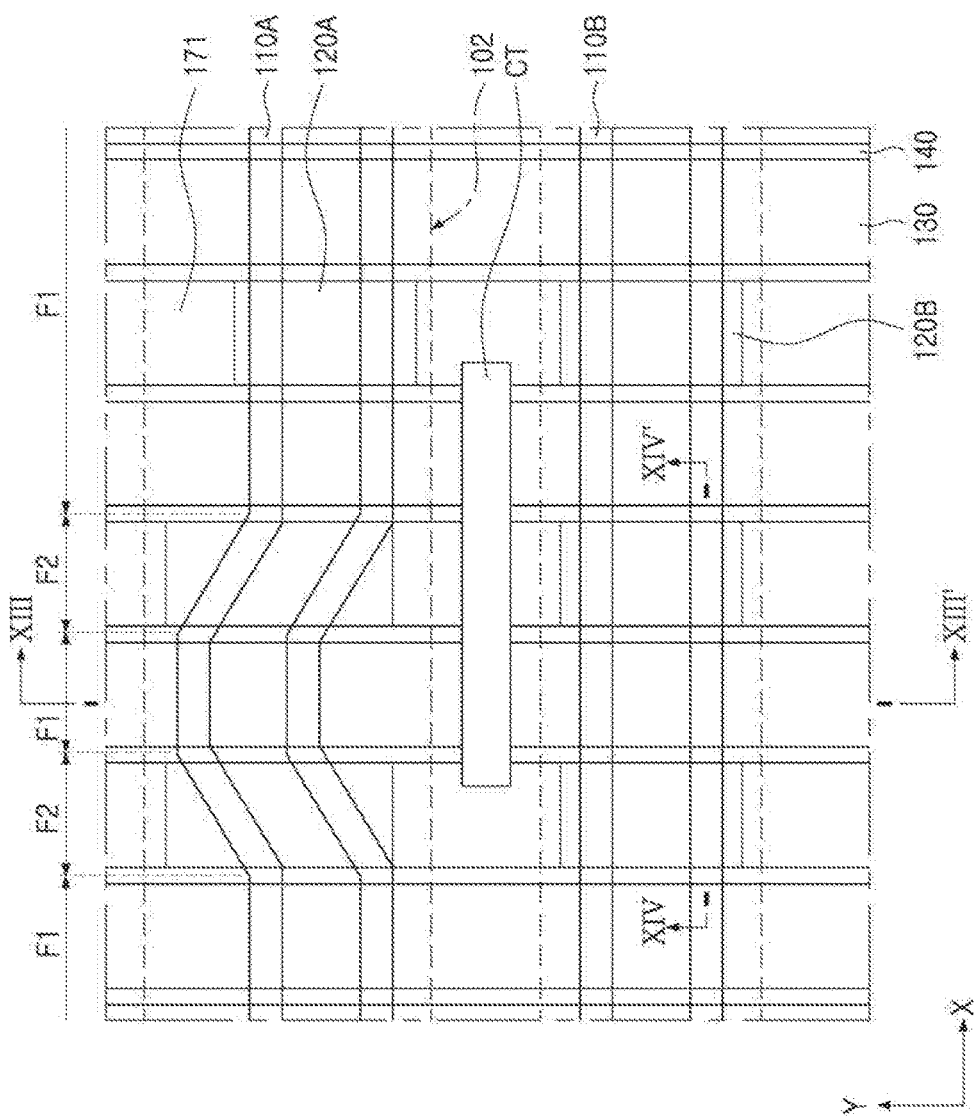
Figure 24:
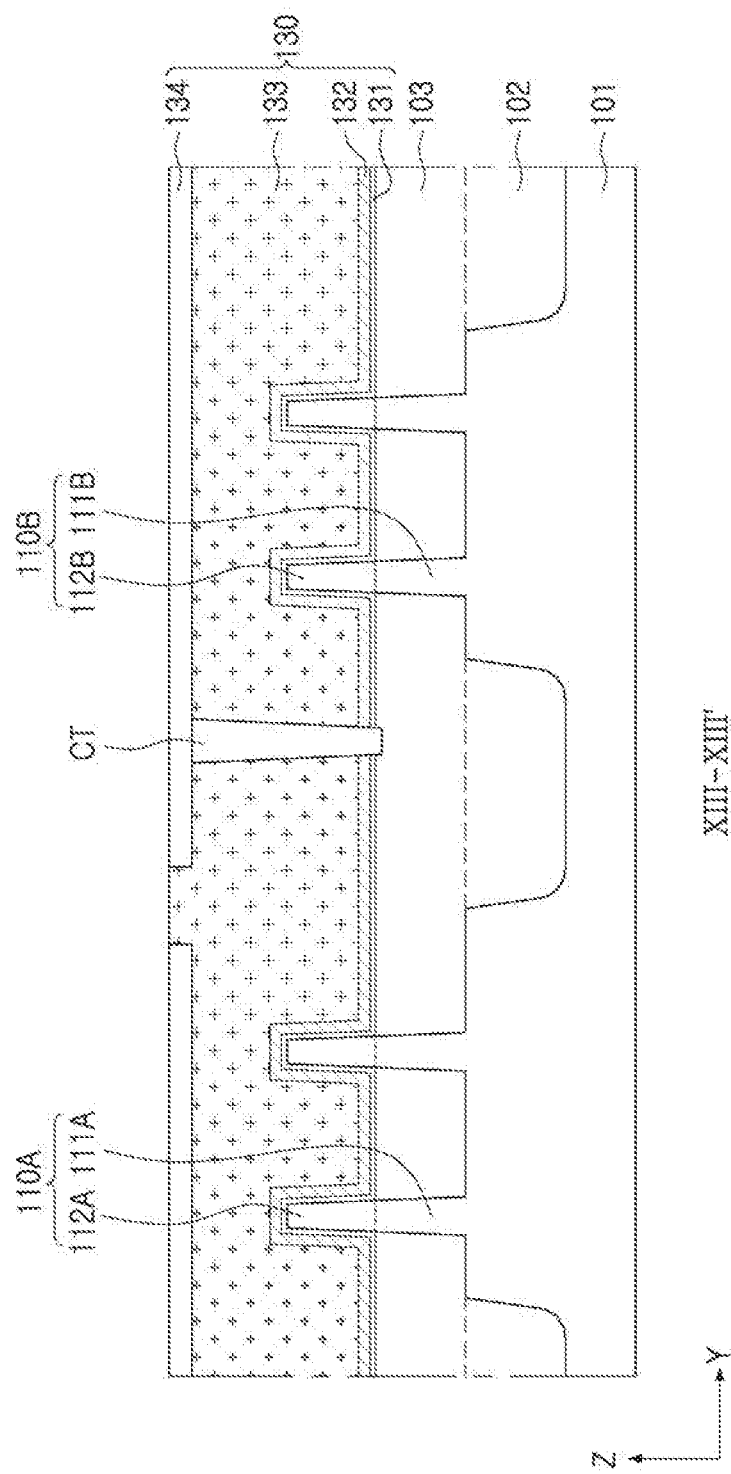
Figure 25:
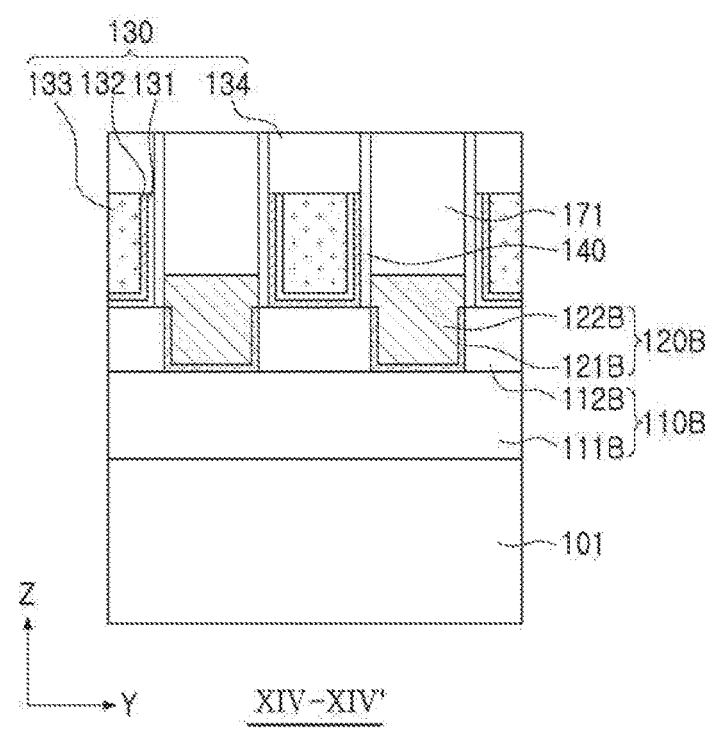

Referring to FIGS. 23 to 25, the dummy gate structure 180 is replaced with the gate structure 130. The gate separation pattern CT is formed to divide the gate structure 130 into sections. In an example embodiment of the present inventive concept, the gate separation pattern CT may be formed prior to the formation of the gate structure 130.

Before replacing the dummy gate structure 180 with the gate structure 130, a first interlayer insulating layer 171 may be formed to cover the dummy gate structure 180 and the source/drain regions 120A and 120B. In an example embodiment of the present inventive concept, an upper surface of the first interlayer insulating layer 171 may be coplanar with an upper surface of the dummy gate structure 180. After forming the first interlayer insulating layer 171, a portion of the dummy gate structure 180 corresponding to the gate separation pattern CT may be removed by an etching process, and an insulating material may fill a region where the portion of dummy gate structure 180 is removed, thus forming the gate separation pattern CT.

When forming the gate separation pattern CT, the dummy gate structure 180 between the adjacent gate spacers 140 may be removed. In an example embodiment of the present inventive concept, after forming the first interlayer insulating layer 171, the mask pattern layer 183 of the dummy gate structure 180 may be removed by a chemical mechanical polishing (CMP) process. The gate structure 130 may be formed in a space between the adjacent gate spacers 140, where the dummy gate structure 180 is removed.

Referring to FIGS. 24 and 25, the gate structure 130 includes the gate insulating layer 131, the first gate metal layer 132, the second gate metal layer 133, and the capping layer 134 sequentially stacked on the semiconductor substrate 101. The gate insulating layer 131 may be conformally formed along an inner surface of the space between the adjacent gate spacers 140 and may include, e.g., oxide, nitride, and/or a high-k dielectric material with a dielectric constant higher than that of silicon oxide ($SiO_2$). The gate insulating layer 131 may cover the first and second fin structures 110A and 110B exposed between the adjacent gate spacers 140.

The first and second gate metal layers 132 and 133 may include, e.g., metal and/or polysilicon. In an example embodiment of the present inventive concept, the first and second gate metal layers 132 and 133 may include different materials. The first gate metal layer 132 may serve as a barrier metal layer to prevent metal diffusion and may include, e.g., titanium nitride (TiN). The second gate metal layer 133 may include metal, e.g., tungsten (W), copper (Cu), and/or molybdenum (Mo), or polysilicon (Si). In an example embodiment of the present inventive concept, an additional metal layer may further be formed between the first gate metal layer 132 and the second gate metal layer 133.

The capping layer 134 may cover the gate insulating layer 131 and the first and second gate metal layers 132 and 133 and may include an insulating material, e.g., silicon nitride ($Si_3N_4$). Referring to FIG. 24, the capping layer 134 may not be formed in a predetermined region in the second direction Y. For example, the capping layer 134 may be divided into a plurality of sections. In the region where the capping layer 134 is not formed, upper surfaces of the first and second gate metal layers 132 and 133 may be exposed.

Figure 26:
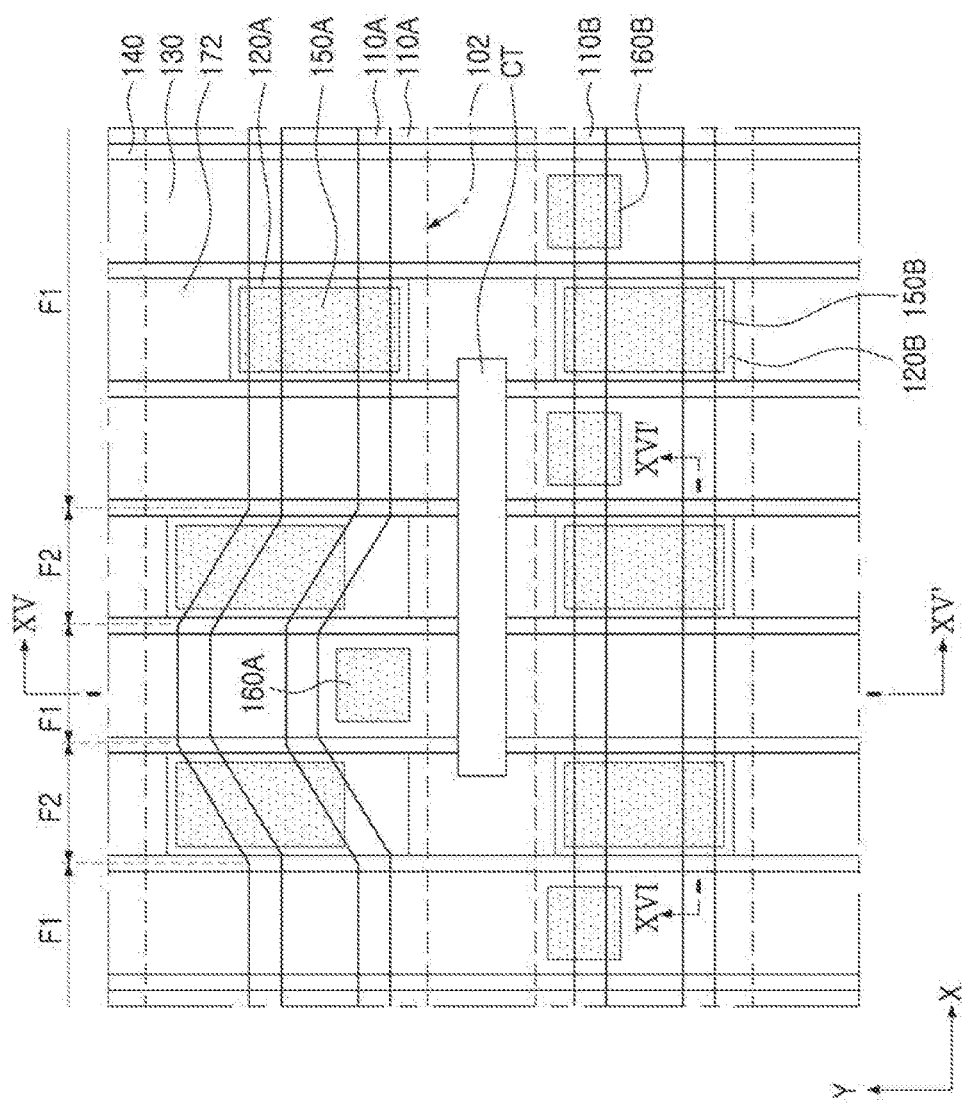
Figure 27:
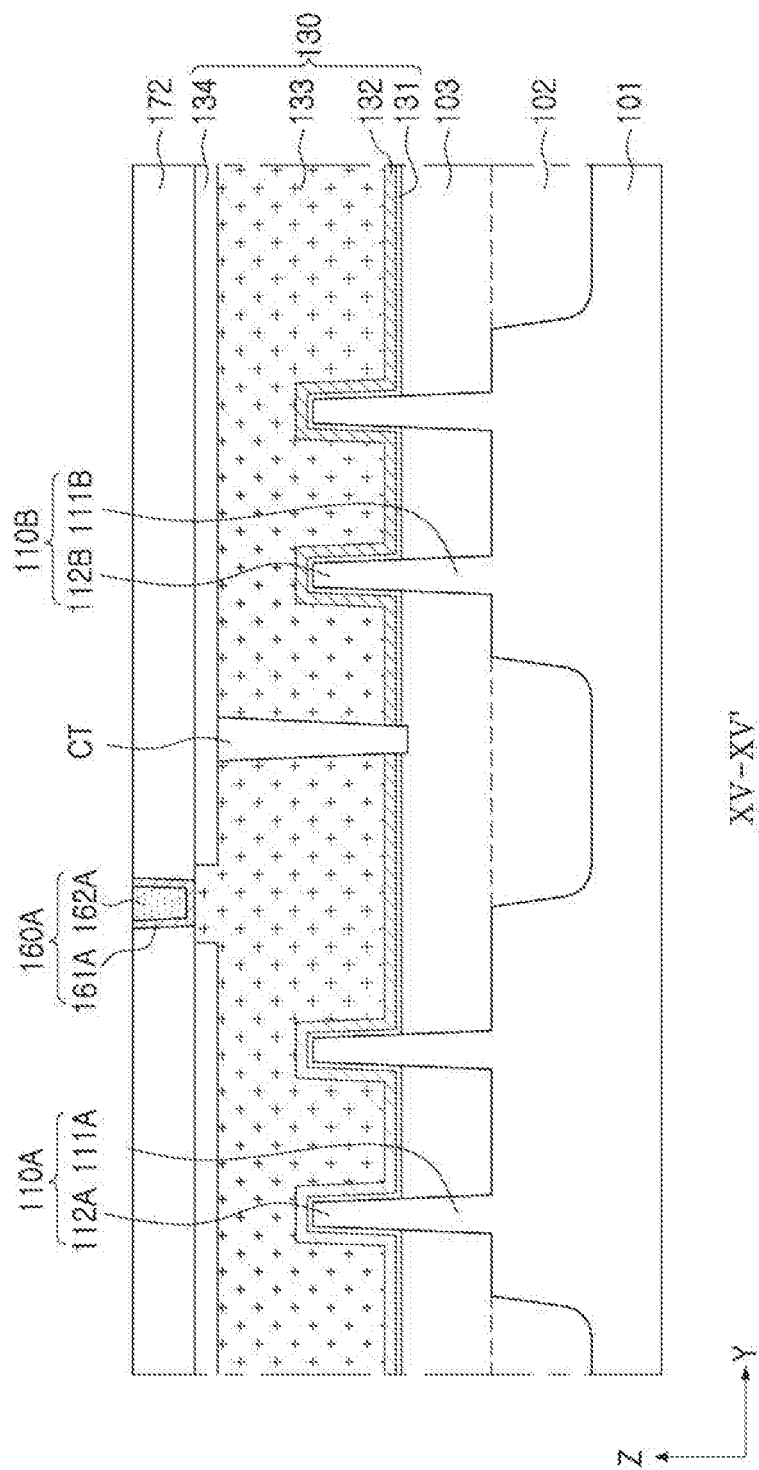
Figure 28:
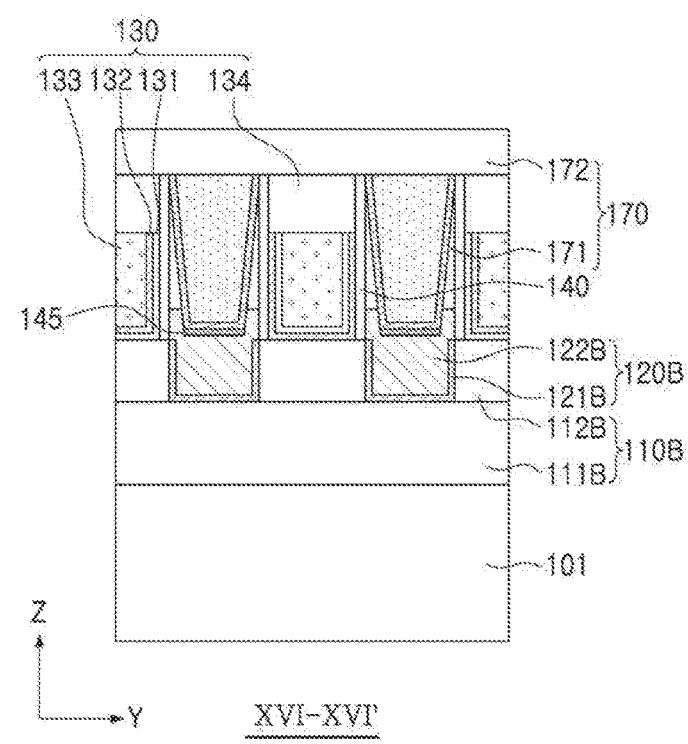

Referring to FIGS. 26 to 28, the first contacts 150A and 150B and the second contacts 160A and 160B are formed. The first contacts 150A and 150B may be respectively connected to the source/drain regions 120A and 120B. The second contacts 160A and 160B may be connected to the gate structure 130.

The first contacts 150A and 150B may be formed by removing a portion of the first interlayer insulating layer 171 by an etching process and filling the removed region with a conductive material. When performing the etching process on the first interlayer insulating layer 171, portions of the source/drain regions 120A and 120B may also be removed. After forming the first contacts 150A and 150B, a second interlayer insulating layer 172 may be formed on the first interlayer insulating layer 171. The first and second interlayer insulating layers 171 and 172 may include, e.g., silicon oxide ($SiO_2$), silicon nitride ($Si_3N_4$), and/or silicon oxynitride (SiON). The first and second interlayer insulating layers 171 and 172 may form the interlayer insulating layer 170. The second contacts 160A and 160B may be formed in a region where a portion of the second interlayer insulating layer 172 is removed and may be connected to the gate structure 130. The second contacts 160A and 160B may be formed by removing a portion of the first interlayer insulating layer 171, in the region of the gate structure 130 where the capping layer 134 is not formed, by an etching process and filling the removed region with a conductive material.

When the process of forming the first contacts 150A and 150B and the second contacts 160A and 160B are not controlled, a short failure in which a respective one of the first contacts 150A and 150B and a respective one of the second contacts 160A and 160B are connected (or short-circuited) may be generated. In addition, as the respective one of the first contacts 150A and 150B and the respective one of the second contacts 160A and 160B are closer to each other, a parasitic capacitance therebetween may increase.

According to an example embodiment of the present inventive concept, the above described problem may be solved by adjustment of a shape of at least one of the first and second fin structures 110A and 110B. As described above with reference to FIGS. 1 and 12, the first fin structure 110A may include the first fin region F1 and the second fin region F2, and the second fin region F2 may extend in a direction different from the first direction X. Thus, the first fin structure 110A may have a bending shape in at least a predetermined section. The bending shape of the first fin structure 110A may allow the first contact 150A to shift its position in the second direction Y and to move away from the second contact 160A. The first contact 150A on the second fin region F2 and the second contact 160A adjacent thereto may have a reduced facing area (or a reduced lateral overlapping area) therebetween. Accordingly, the short failure in which the first contact 150A is short-circuited with the second contact 160A may be prevented or reduced, and the parasitic capacitance between the first contact 150A and the second contact 160A may be minimized.

As shown in FIG. 26, the source/drain region 120A on the second fin region F2 may be disposed at a position level different from that of another source/drain region 120A on the first fin region F1, in the second direction Y. Thus, the first contact 150A may be formed remote from the second contact 160A and a facing area between the first contact 150A and the second contact 160A may be reduced. Accordingly, the parasitic capacitance between the first contact 150A and the second contact 160A may be reduced and the short failure may be reduced or prevented from occurring during the formation of the first contact 150A and the second contact 160A. The second contact 160A may be connected to the upper surface of the gate structure 130, exposed in a region where the capping layer 134 is not formed.

While the present inventive concept has been shown and described with reference to example embodiments thereof, it will be understood by those of ordinary skill in the art that various changes in form and details may be made thereto without departing from the spirit and scope of the present inventive concept as set forth by the following claims.

What is claimed is:
1. A semiconductor device comprising:
   a substrate;
   a first fin structure protruding from the substrate in a direction perpendicular to an upper surface of the substrate, the first fin structure including first fin regions and second fin regions, the first fin regions extending in a first direction, and the second fin regions extending in a second direction different from the first direction;
   source/drain regions disposed on the first fin structure;
   a gate structure intersecting the first fin structure;
   a first contact connected to one of the source/drain regions; and
   a second contact connected to the gate structure, the second contact being between the second fin regions in plan views,
   wherein the substrate comprises an active region and an isolation region, and
   the isolation region comprises a first isolation region and a second isolation region that are connected to each other and have different widths in a third direction perpendicular to the first direction.

2. The semiconductor device of claim 1, wherein
   the active region comprises the first fin structure, and
   a portion of the second contact is disposed on the isolation region.

3. The semiconductor device of claim 1, wherein each of the second fin regions of the first fin structure is connected to one of the source/drain regions.

4. The semiconductor device of claim 3, further comprising a power line on the substrate,
   wherein at least one of the source/drain regions is connected to the power line.

5. The semiconductor device of claim 3, wherein the gate structure intersects the first fin regions of the first fin structure.

6. The semiconductor device of claim 1, further comprising a plurality of second fin structures,
   wherein the plurality of second fin structures extend parallel to each other in the first direction.

7. The semiconductor device of claim 1, wherein the gate structure intersects at least one of the second fin regions of the first fin structure.

8. The semiconductor device of claim 1, wherein two of the source/drain regions are disposed at opposite sides of the gate structure, and
   the two source/drain regions are disposed at different position levels in a third direction perpendicular to the first direction.

9. The semiconductor device of claim 1, wherein one of the source/drain regions is connected to at least two of a plurality of first fin structures.

10. The semiconductor device of claim 1, wherein the second isolation region has a width greater than a width of the first isolation region in the third direction.

11. The semiconductor device of claim 10, wherein at least a portion of the second contact overlaps the second isolation region in plan view.

12. A semiconductor device comprising:
    a substrate including a first region and a second region;
    a first fin structure and a second fin structure extending to be spaced apart from each other in a first direction parallel to an upper surface of the substrate, in the first region and the second region;
    a gate structure intersecting at least one of the first fin structure and the second fin structure; and
    a gate contact connected to the gate structure,
    wherein a distance between the first fin structure and the second fin structure in the first region is less than a distance between the first fin structure and the second fin structure in the second region,
    the gate contact is disposed between the first fin structure and the second fin structure in the second region, in plan view, and
    in the first region, the first fin structure and the second fin structure extend in a second direction intersecting the first direction and parallel to the upper surface of the substrate.

13. The semiconductor device of claim 12, wherein, in the second region, a portion of the first fin structure extends in a third direction different from the second direction and parallel to the upper surface of the substrate.

14. The semiconductor device of claim 13, further comprising source/drain regions disposed on the first fin structure,
    wherein, in the second region, at least one of the source/drain regions is disposed on the portion of the first fin structure.

15. The semiconductor device of claim 13, wherein a plurality of gate structures intersect the first fin structure, and
at least one of the plurality of gate structures is on the portion of the first fin structure in the second region.

16. The semiconductor device of claim 12, further comprising:
source/drain regions disposed on the first fin structure, and
a power line disposed on the substrate, the power line connected to at least one of the source/drain regions,
wherein the first fin structure is bent toward the power line in the second region, in plan view.

17. The semiconductor device of claim 12, further comprising:
source/drain regions disposed on the first fin structure, and
source/drain contacts disposed on the source/drain regions,
wherein some of the source/drain contacts are disposed at different position levels in the first direction.

18. A semiconductor device comprising:
a substrate including an isolation region and an active region, the isolation region including a first isolation region and a second isolation region, and the active region including a first active region and a second active region that are separated by the isolation region;
a first fin structure disposed in the first active region;
a second fin structure disposed in the second active region;
a gate structure intersecting the first fin structure; and
a gate contact connected to the gate structure, the gate contact being adjacent to a boundary between the first active region and the second isolation region,
wherein the first fin structure includes first fin regions and second fin region,
the first fin regions extend in a first direction, and
the second fin region connects the first fin regions and extends in a second direction different from the first direction.

* * * * *